US012648426B2

(12) United States Patent
Syu et al.

(10) Patent No.: US 12,648,426 B2
(45) Date of Patent: Jun. 2, 2026

(54) ANALOG-CELLS-BOUNDARY REGION WITH BURIED POWER GRID SEGMENT, SEMICONDUCTOR DEVICE INCLUDING SAME AND METHOD OF MANUFACTURING SAME

(71) Applicant: TAIWAN SEMICONDUCTOR MANUFACTURING COMPANY, LTD., Hsinchu (TW)

(72) Inventors: Ming-Cheng Syu, Hsinchu (TW); Yu-Tao Yang, Hsinchu (TW); Chung-Ting Lu, Hsinchu (TW); Po-Zeng Kang, Hsinchu (TW); Amit Kundu, Hsinchu (TW); Wen-Shen Chou, Hsinchu (TW); Yung-Chow Peng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 630 days.

(21) Appl. No.: 18/158,240

(22) Filed: Jan. 23, 2023

(65) Prior Publication Data

US 2024/0014136 A1     Jan. 11, 2024

Related U.S. Application Data

(60) Provisional application No. 63/367,761, filed on Jul. 6, 2022.

(51) Int. Cl.
*H01L 23/528* (2006.01)
*H01L 21/768* (2006.01)
(Continued)

(52) U.S. Cl.
CPC ........ *H01L 23/5286* (2013.01); *H01L 21/768* (2013.01); *H01L 23/5226* (2013.01); *H10D 84/944* (2025.01); *H10D 89/10* (2025.01)

(58) Field of Classification Search
CPC .... H10D 89/10; H10D 84/658; H10D 84/941; H10D 84/944; H10D 84/0133;
(Continued)

(56) References Cited

U.S. PATENT DOCUMENTS

| | | |
|---|---|---|
| 7,432,562 B2 | 10/2008 | Bhattacharyya |
| 10,658,358 B2 | 5/2020 | Or-Bach et al. |

(Continued)

*Primary Examiner* — Thanhha S Pham
(74) *Attorney, Agent, or Firm* — Hauptman Ham, LLP

(57) ABSTRACT

A semiconductor device includes: first and second active regions (ARs) included correspondingly in abutting first and second analog cell regions, a region where the first and second analog cell regions abut (analog-cell-boundary (ACB) region) extending from about a top boundary of the first AR to about a bottom boundary of the second AR; via-to-PGBM_1st-segment contact structures (VBs) correspondingly being under the first or second ARs, a long axis of each VB and a short axis of each of the first and second ARs having about a same length; and a PG segment in a first buried metallization layer (PGBM_1st segment) under the VBs, the PGBM_1st segment underlapping a majority of each of the VBs, and a Y-midline of the PGBM_1st segment being at or proximal to where the first and second analog cell regions abut and thus being at or proximal to a middle of the ACB region.

20 Claims, 25 Drawing Sheets

(51) Int. Cl.
    *H01L 23/522*     (2006.01)
    *H10D 84/90*     (2025.01)
    *H10D 89/10*     (2025.01)

(58) Field of Classification Search
    CPC ............ H10D 84/0186; H01L 23/5286; H01L
                 21/768; H01L 23/5226; H01L 23/485
    See application file for complete search history.

(56)                  References Cited

U.S. PATENT DOCUMENTS

| | | |
|---|---|---|
| 2018/0277530 A1 | 9/2018 | Or-Bach et al. |
| 2021/0193655 A1 | 6/2021 | Or-Bach et al. |
| 2021/0305278 A1* | 9/2021 | Shiraki .................. H10D 89/10 |

\* cited by examiner

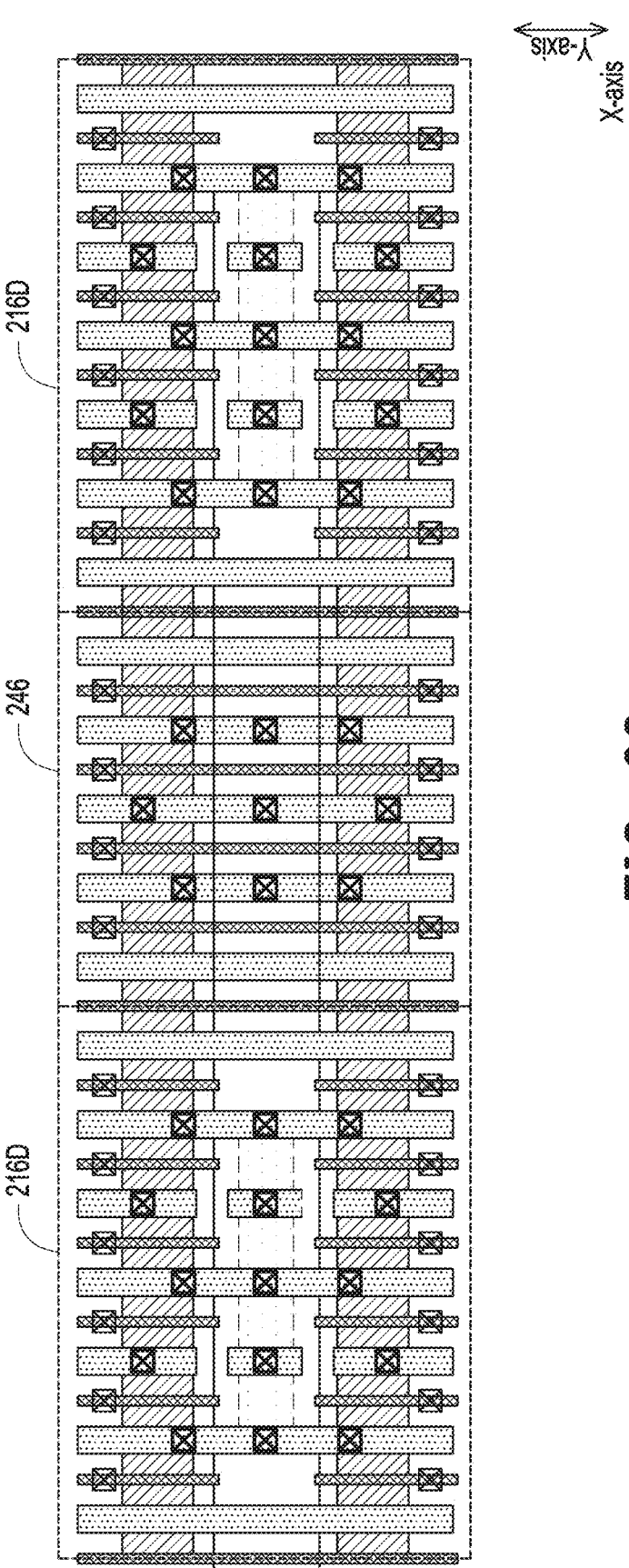
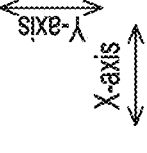
FIG. 2Q

300

ANALOG-CELLS-BOUNDARY REGION WITH BURIED POWER GRID SEGMENT, SEMICONDUCTOR DEVICE INCLUDING SAME AND METHOD OF MANUFACTURING SAME

PRIORITY CLAIM

The present application claims the priority of U.S. Provisional Application No. 63/367,761, filed Jul. 6, 2022, which is incorporated herein by reference in its entirety.

BACKGROUND

The integrated circuit (IC) industry produces a variety of analog and digital semiconductor devices to address issues in different areas. Developments in semiconductor process technology nodes have progressively reduced component sizes and tightened spacing resulting in progressively increased transistor density. ICs progressively become smaller.

In general, regarding IC architecture, guard ring structures serve purposes including providing electrical isolation and/or spatial isolation between adjacent circuit elements. For example, guard ring structures are placed between digital circuit regions and analog circuit regions, or between digital circuit regions and radio frequency (RF) component regions, in a mixed signal IC to reduce the degree to which noise (e.g., carrier injection) from the digital circuit regions affects the analog circuit regions or RF component regions.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

FIGS. 2A, 2D, 2G and 2I-2T are corresponding layout diagrams, in accordance with some embodiments.

DETAILED DESCRIPTION

Figures 1A, 1B:
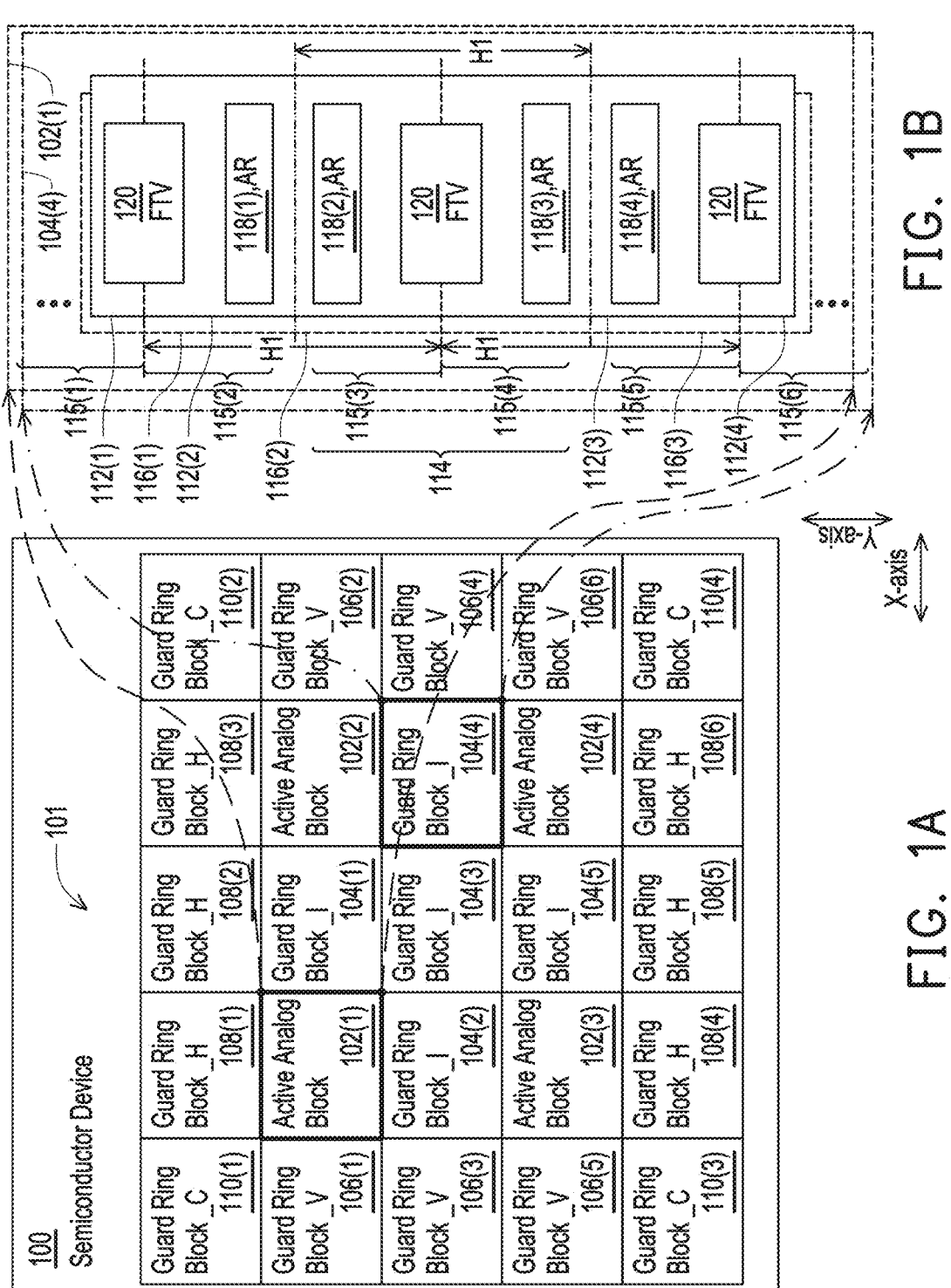
FIGS. 1A-1B are corresponding block diagrams of a semiconductor device, in accordance with some embodiments.

The following disclosure discloses many different embodiments, or examples, for implementing different features of the subject matter. Examples of components, materials, values, steps, operations, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows include embodiments in which the first and second features are formed in direct contact, and further include embodiments in which additional features are formed between the first and second features, such that the first and second features are in indirect contact. In addition, the present disclosure repeats reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, are used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus is otherwise oriented (rotated 90 degrees or at other orientations) and the spatially relative descriptors used herein are likewise interpreted accordingly. In some embodiments, the term standard cell structure refers to a standardized building block included in a library of various standard cell structures. In some embodiments, various standard cell structures are selected from a library thereof and are used as components in a layout diagram representing a circuit.

In some embodiments, a semiconductor device includes a region where two analog cell regions abut (analog-cells-boundary (ACB)) relative to, e.g., the Y-axis. The ACB region is included in a larger analog region of analog cell regions. For example, the larger analog region includes active analog cell regions surrounded by corresponding guard ring structures, or the like. The ACB region includes first and second active regions (ARs) having long axes extending in a first direction (e.g., parallel to the X-axis), where the first and second ARs are included correspondingly in the abutting first and second analog cell regions. The ACB region extends from underneath the first AR to underneath the second AR. In such embodiments, the ACB region includes a buried power grid (PG) segment. A midline of the buried PG segment relative to a second direction (e.g., parallel to the Y-axis) (Y-midline) is at or proximal to a location where the first and second analog cell regions abut, and the Y-midline of the buried PG segment is at or proximal to a middle of the ACB region (114/214A).

In counterpart ACB regions of a larger counterpart analog region according to another approach: the layer containing the first and second ARs (AR layer) is otherwise substantially free of power grid segments that carry electrical signals/voltages such as VDD, VSS, or the like, and conductive segments that carry corresponding data signals and/or control signals; and underlying layers below the AR layer are substantially free of power grid segments that carry electrical signals/voltages such as VDD, VSS, or the like, and conductive segments that carry corresponding data signals and/or control signals. As a result, the frontside of the larger counterpart analog region according to the other approach suffers routing congestion because the frontside must accommodate power grid segments that carry electrical signals/voltages such as VDD, VSS, or the like, as well as conductive segments that carry corresponding data signals and/or control signals. As part of insight which led the present inventors to develop at least some embodiments, the inventors recognized that such otherwise empty space in some of the AR regions can be repurposed to facilitate the use of a backside power grid. More particularly, the inventors recognized that at least some of the otherwise empty space in (1) at least some of the ACB regions in the active analog cell regions of the larger analog region and/or (2) at least some of the ACB regions in some types of guard ring blocks (e.g., interior guard ring blocks of interior guard ring cell regions) which comprise the guard ring structures of the larger analog region can be repurposed to facilitate the use of a backside power grid.

In some embodiments, some of the otherwise empty space in the ACB regions is repurposed for structures which facilitate the use of a backside power grid in the ACB regions and thus in the larger analog region, where the power grid includes segments that are electrically coupled to power system signals/voltages such as VDD, VSS, or the like. The use of such structures in the ACB region frees space on the frontside of the larger analog region otherwise occupied by power grid segments. The space freed by using the backside power grid reduces frontside routing congestion, thereby facilitating the routing conductive segments that carry corresponding data signals and/or control signals.

In some embodiments, the two abutting analog cells which comprise the ACB region are in an active analog block of analog cell regions, where the active analog block is surrounded by a guard ring structure, and where the guard ring structure is comprised of various types of guard ring blocks. In some embodiments, the two abutting analog cell which comprise the ACB region are dummy analog cell regions in an interior guard ring block of interior guard ring cell regions, where the interior guard ring block is included amongst various types of guard ring blocks that comprise a guard ring structure, and where the guard ring structure surrounds an active analog block of analog cell regions. In some embodiments, a dummy analog cell region is an analog cell region that does not include/represent a functional circuit.

In some embodiments, a semiconductor device has an analog-cell-boundary (ACB) region having a buried power grid (PG) segment, the semiconductor device including first and second active regions (ARs) having long axes extending in a first direction (e.g., parallel to the X-axis) and being included correspondingly in first and second analog cell regions, the ACB region extending from underneath the first AR to underneath the second AR. In some of such embodiments (e.g., FIGS. 2A, 2I & 2J, or the like), the semiconductor device further includes: via-to-PGBM_1st-segment contact structures (VBs) having long axes extending in a second direction (e.g., parallel to the Y-axis) perpendicular to the first direction, the VBs correspondingly being under the first or second ARs, the long axis of each VB and a short axis of each of the first and second ARs having about a same length; and a first type of PG segment in a first buried metallization (BM_1st) layer (PGBM_1st segment) under the VBs, the PGBM_1st segment underlapping a majority of each of the VBs. In some of such embodiments (e.g., FIGS. 2D, 2G, 2K, 2L, 2M & 2N, or the like), the semiconductor device further includes: a feedthrough via (FTV) extending in the first direction, being in the gap between the first and second ARs and under the MD contact structures; and a second type of PGBM_1st segment under the FTV.

A midline of the FTV relative to the second direction (e.g., parallel to the Y-axis) (Y-midline) is at or proximal to a location where the first and second analog cell regions abut, and the Y-midline of the FTV is at or proximal to a middle of the ACB region.

Some embodiments are directed to corresponding methods of making such semiconductor devices.

FIG. 1A is a block diagram of a semiconductor device 100, in accordance with some embodiments.

FIG. 1B is a block diagram representing an exploded view of portions of semiconductor device 100, in accordance with some embodiments.

In FIG. 1A. semiconductor device 100 includes a guard ring region 101, the latter including a guard ring structures that correspondingly surround active analog blocks 102(1)-102(4). More particularly, in addition to including active analog blocks 102(1)-102(4), guard ring region 101 includes: interior guard ring blocks 104(1)-104(5); vertically-abuttable exterior guard ring blocks 106(1)-106(6), where vertical abutment is relative to, e.g., the Y-axis; horizontally-abuttable exterior guard ring blocks 108(1)-108 (6), where horizontal abutment is relative to, e.g., the X-axis; and vertically-abuttable and/or horizontally-abuttable, i.e., corner, exterior guard ring blocks 110(1)-110(4).

Each of active analog blocks 102(1)-102(4) includes analog cell regions and, in some embodiments, one or more feedthrough (FTC) cell regions; see FIG. 1B. Each of interior guard ring blocks 104(1)-104(5) includes one or more interior guard ring cell regions and, in some embodiments, one or more FTC cell regions; see FIG. 1B. Each of vertically-abuttable exterior guard ring blocks 106(1)-106 (6) includes one or more vertically-abuttable exterior guard ring cell regions. Each of horizontally-abuttable exterior guard ring blocks 108(1)-108(6) includes one or more horizontally-abuttable exterior guard ring cell regions. Each of vertically-abuttable and/or horizontally-abuttable, i.e., corner, exterior guard ring blocks 110(1)-110(4) includes one or more vertically-abuttable and/or horizontally-abuttable, i.e., corner, exterior guard ring cell regions.

In FIG. 1A, active analog block 102(1) is surrounded by a guard ring structure (relative to a clockwise progression) comprised of: corner guard ring block 110(1); horizontally-abuttable exterior guard ring blocks 108(1) and 108(2); interior guard ring blocks 104(1), 104(3) and 104(2); and vertically-abuttable exterior guard ring blocks 106(3) and 106(1). Active analog block 102(2) is surrounded by a guard ring structure (relative to a clockwise progression) comprised of: horizontally-abuttable exterior guard ring blocks 108(2) and 108(3); corner guard ring block 110(2); vertically-abuttable exterior guard ring blocks 106(2) and 106(4); and interior guard ring blocks 104(4), 104(3) and 104(1).

Active analog block 102(3) is surrounded by a guard ring structure (relative to a clockwise progression) comprised of: vertically-abuttable exterior guard ring block 106(3); interior guard ring blocks 104(2), 104(3) and 104(5); horizontally-abuttable exterior guard ring blocks 108(5) and 108(4); corner guard ring block 110(3); and vertically-abuttable exterior guard ring block 106(5). Active analog block 102(4) is surrounded by a guard ring structure (relative to a clockwise progression) comprised of: interior guard ring blocks 104(3) and 104(4); vertically-abuttable exterior guard ring blocks 106(4) and 106(6); corner guard ring block 110(4); horizontally-abuttable exterior guard ring blocks 108(6) and 108(5); and interior guard ring block 104(5).

Regarding FIG. 1A, in some embodiments, an active analog block is surrounded by a guard ring structure to protect the active analog block from noise generated by digital circuit blocks (not shown) of digital circuit cell regions (not shown) which are nearby albeit outside the guard ring structure, as discussed below.

A digital circuit includes, e.g., field-effect transistors (FETs) such as metal oxide semiconductor FETs (MOSFETs), or the like. In such a digital circuit, the voltage value on a gate terminal of a MOSFET is selectively switched from rail to rail resulting in the MOSFET being either substantially completely turned off or substantially completely turned on in a binary manner. For example, the voltage value on a gate terminal of a MOSFET is selectively switched between a voltage value equal to the first reference value (Vr, e.g., VDD) and the second reference value (e.g., VSS, Vgnd, or the like). When turned on, a given portion of the substrate corresponding to the channel of the MOSFET is substantially completely depleted of the majority carriers of the substrate, such that the given portion of the substrate is referred to as the depletion region, and the corresponding temporary mode of operation of the MOSFET is referred to as depletion mode or saturation mode. When the channel is formed/induced, not only is the depletion region temporarily depleted of the majority carriers, the depletion region is temporarily augmented with the minority carriers of the substrate, i.e., the density of minority carriers in the depletion region is temporarily increased, which temporarily forms or induces a conductive channel in the substrate.

In an analog circuit that includes a MOSFET, the amount of current that flows through the MOSFET, i.e., the degree to which the MOSFET is turned on, is varied in a continuous manner. The continuous/analog manner of controlling current flow in the MOSFET of an analog circuit contrasts with the binary manner in which current is controlled to flow through a MOSFET in a digital circuit. In an analog circuit, temporary current flow through the MOSFET is continuously varied in proportion to the voltage value on the gate terminal of the MOSFET (gate voltage) such that the corresponding temporary mode of operation of the MOSFET is referred to as ohmic mode. More particularly, the degree to which the depletion region becomes depleted varies in proportion to the magnitude of the gate voltage, and ranges from being substantially incompletely depleted to being substantially completely depleted. In the ohmic mode, the gain of the MOSFET is sensitive to the potential difference between the gate voltage and a voltage value of the substrate. In the ohmic mode, a small change in the voltage value of the substrate can have a large effect on the degree to which the depletion region becomes depleted and thus the amount of current conducted through the channel.

In general, the architecture of FETs, e.g., MOSFETs, is susceptible to the temporary formation of parasitic bipolar junction transistors (BJTs) because, under some circumstances, the binary manner of operation tends to promote carrier injection. Under first circumstances, the binary manner of operation of the FET in digital circuit causes majority carrier injection, which can temporarily form a vertical parasitic BJT. Under second circumstances, the binary manner of operation of the FET in digital circuit causes minority carrier injection, which can temporarily form a lateral (horizontal) parasitic BJT. Latchup is a phenomenon experienced by FETs, e.g., MOSFETs, which results from the temporary formation of parasitic BJTs. During latchup, a low impedance path forms between a positive system voltage, e.g., first reference value (Vr), and a second system reference voltage, e.g., the second reference value (Vgnd), which causes excessive current flow.

The temporary formation of parasitic BJTs is a problem for digital circuits and analog circuits. Furthermore, before the injection of carriers rises to a level that causes the formation of parasitic BJTs, the injection of carriers due to the binary manner of operation of FETs in digital circuits poses an additional problem for the operation of FETs in adjacent analog circuits. The additional problem is caused by the migration of carriers in the substrate, which are injected by the FETs of the digital circuits, to the vicinity of the FETs of the analog circuits. The migrated carriers skew the potential difference between the gate voltage the digital circuit's FETs and the voltage value of the substrate in the vicinity of the digital circuit's FETs. Again, in the ohmic mode, a small change in the voltage value of the substrate in the vicinity of the analog circuit's FETs can have a large effect on the degree to which the depletion region of the analog circuit's FETs become depleted, and thus a large effect on the amount of current conducted through the channels of the analog circuit's FETs.

Regarding FIG. 1A, among other uses, guard ring structures are used to reduce the degree to which noise (e.g., carrier injection) from digital circuits affects adjacent analog circuits. Surrounding analog circuits an active analog block with a guard ring structure, i.e., placing/locating the active analog block inside the guard ring structure, protects the analog circuits of the analog cell regions of the active analog block against noise (e.g., carrier injection) from digital circuits that are adjacent albeit outside the guard ring structure.

Again, FIG. 1B is a block diagram representing an exploded view of portions of semiconductor device 100, in accordance with some embodiments. More particularly, FIG. 1B serves as an exploded view of active analog block 102(1) and alternatively as an exploded view of interior guard ring block 104(4).

As part of the insight (discussed above) which led the present inventors to develop at least some embodiments, the inventors recognized that at least some of the otherwise empty space in (1) at least some of the analog-cells-boundary (ACB) regions in the active analog cell regions of the larger analog region according to the other approach and/or (2) at least some of the ACB regions in some types of guard ring blocks (e.g., interior guard ring blocks of interior guard ring cell regions) which comprise the guard ring structures of the larger analog region according to the other approach can be repurposed to facilitate the use of a backside power grid.

In FIG. 1B, in some embodiments, active analog blocks 102(1)-102(4) of FIG. 1A include instances of ACB region 114 of FIG. 1B. Active analog blocks 102(1)-102(4) are counterparts to the active analog blocks containing the active analog cell regions according to the other approach. Instances of ACB region 114 are counterparts to the ACB regions of the active analog cell regions within the active analog blocks. according to the other approach.

In some embodiments, interior guard ring blocks 104(1)-104(5) of FIG. 1A include instances of ACB region 114 of FIG. 1B. Interior guard ring blocks 104(1)-104(5) are counterparts to the interior guard ring blocks of guard ring structures according to the other approach, where the interior guard ring blocks according to the other approach contain the active analog cell regions according to the other approach. Instances of ACB region 114 are counterparts to the ACB regions of the cell regions within the active analog blocks. according to the other approach. In some embodiments, interior guard ring blocks 104(1)-104(5) of FIG. 1A represent the counterparts of at least some of the interior guard ring blocks which comprise the guard ring structures of the larger analog region according to the other approach.

FIG. 1B includes cell regions 112(1)-112(4) that abut each other relative to, e.g., the Y-axis. Relative to, e.g., the X-axis, cell regions 112(1)-112(4) are substantially aligned. However, as a drawing expedient to facilitate visual separation of cell regions 112(1)-112(4) from each other in FIG. 1, cell regions 112(1)-112(4) are shown as slightly offset from each other relative to the X-axis.

Cell region 112(2) includes border regions 115(2) and 115(3). Relative to the Y-axis: border region 115(2) includes a first space occupied by an active region (AR) 118(1) and a second space between a top boundary of cell region 112(2) and AR 118(1); and border region 115(3) includes a first space occupied by an AR 118(2) and a second space between a bottom boundary of cell region 112(2) and AR 118(2). Cell region 112(3) includes border regions 115(4) and 115(5). Relative to the Y-axis: border region 115(4) includes a first space occupied by AR 118(3) and a second space between a top boundary of cell region 112(3) and AR 118(3); and border region 115(5) includes a first space occupied by AR 118(4) and a second space between a bottom boundary of cell region 112(3) and AR118(4). Cell region 112(1) similarly includes, among other things, border region 115(1). Cell region 112(4) similarly includes, among other things, border region 115(6).

In FIG. 1B, ACB region 114 includes border regions 115(3) and 115(4). ACB region 114 is occupied by a feedthrough cell (FTC) region 116(2). FIG. 1B further includes FTC regions 116(1) and 116(3). Relative to the X-axis, FTC regions 116(1)-116(3) are substantially aligned. However, as a drawing expedient to facilitate visual separation of FTC regions 116(1)-116(3) from each other in FIG. 1, FTC regions 116(1)-116(3) are shown as slightly offset from each other relative to the X-axis.

In a context in which FIG. 1B serves as an exploded view of active analog block 102(1), cell regions 112(1)-112(4) represent active analog cell regions. In some embodiments, an active analog cell region is an analog cell region that includes/represents a functional circuit, e.g., active analog cell region 246 of FIG. 2Q.

In a context in which FIG. 1B serves as an exploded view of interior guard ring block 104(4), FIG. 1B, cell regions 112(1)-112(4) represent interior guard ring cell regions. In some embodiments, a dummy analog cell region is an analog cell region that does not include/represent a functional circuit, e.g., dummy cell region 244 of FIG. 2P.

In FIG. 1B, each of FTC regions 116(1)-116(3) includes a feedthrough via (FTV) 120; see FIGS. 2D, 2G, 2I, 2J, 2K, 2L, 2M and 2N, or the like. In some embodiments, each of FTC regions 116(1)-116(3) further includes a via-to-PGBM_1st-segment contact structures (VB); see FIG. 2J, or the like. In some embodiments, each of FTC regions 116 (1)-116(3) does not include FTV 120 but includes VBs; see FIGS. 2A, 2I and 2K, or the like. In some embodiments, each of FTC regions 116(1)-116(3) further includes a via-to-MD (VD) rail (VDR); see FIGS. 2G, 2J, 2L and 2N, or the like.

In FIG. 1B, cell regions 112(1)-112(4) have a height H1 relative to the Y-axis. Likewise, each of FTC regions 116 (1)-116(3) has a height of H1. In some embodiments, H1 is greater than about 20 nanometers (nm). In some embodiments, H1 is about 31 nm. In some embodiments, H1 is about 90 nm.

Figure 2A:
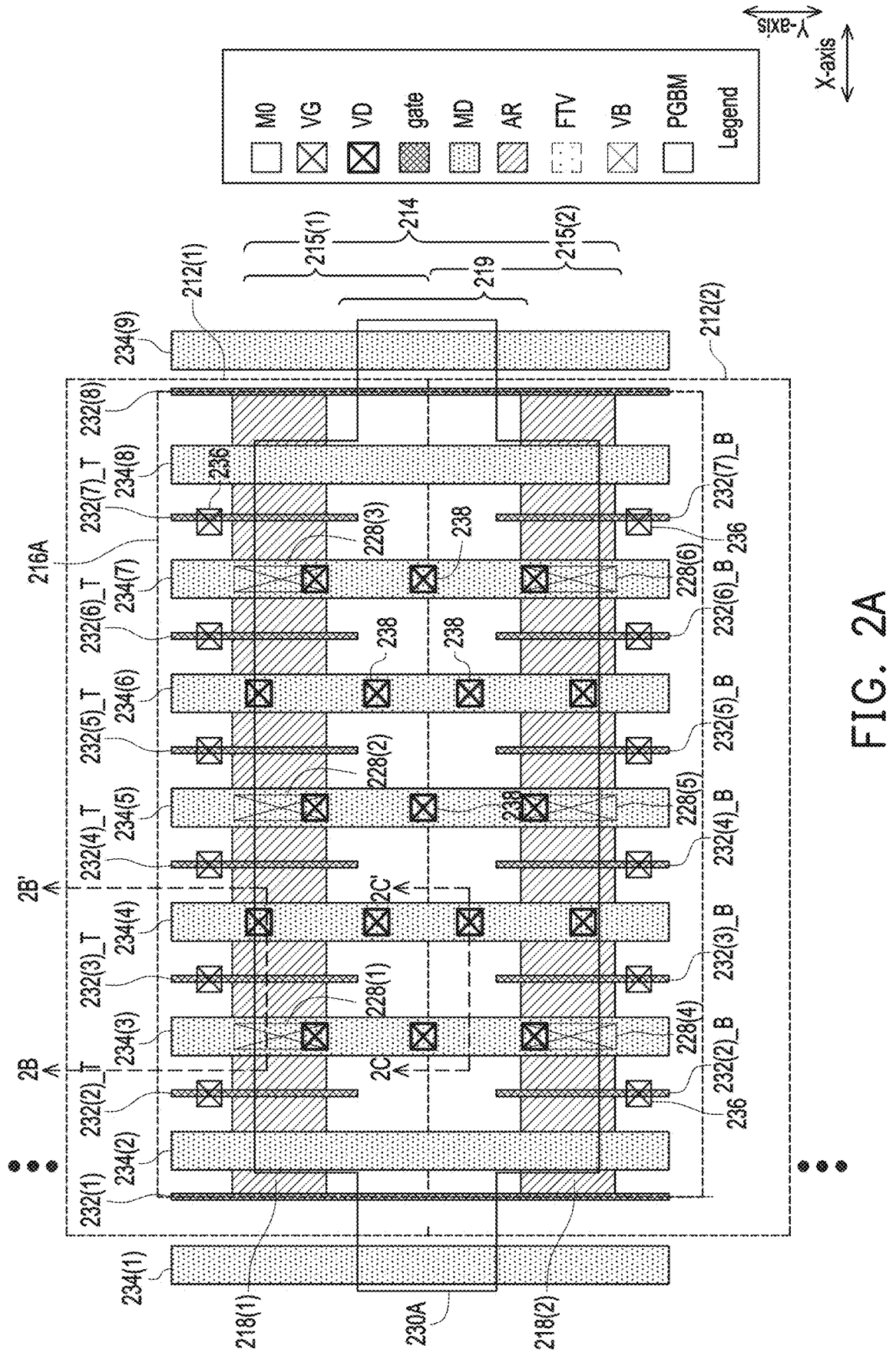

FIG. 2A is a layout diagram of an FTC cell region 216A, in accordance with some embodiments.

Figure 2B:
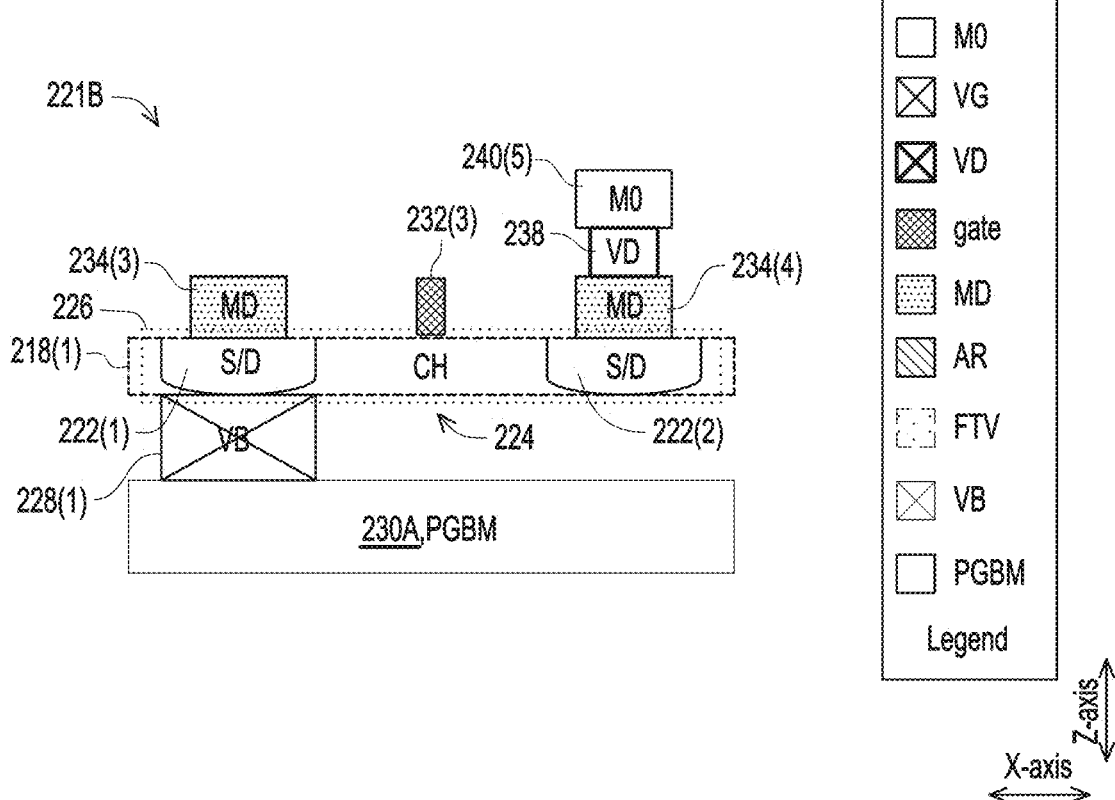
FIGS. 2B-2C, 2E-2F and 2H are corresponding cross-sections, in accordance with some embodiments.
Figure 2C:
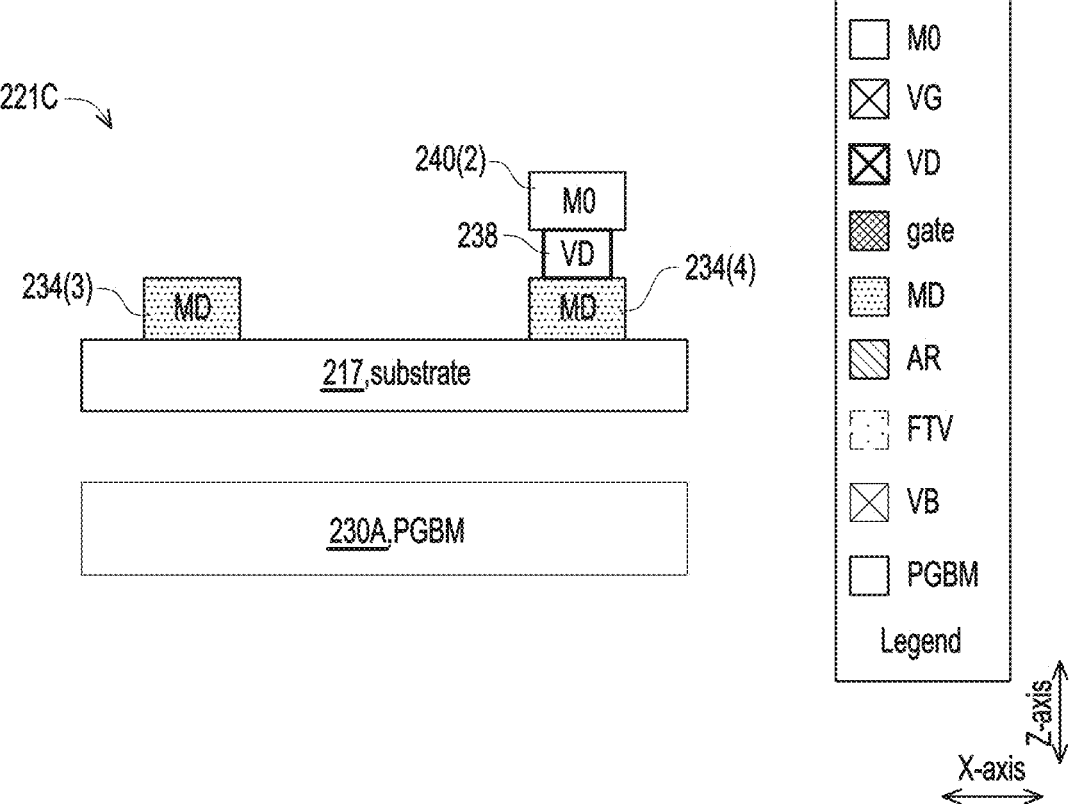

FIGS. 2B-2C are corresponding cross-sections 221B and 221C of an FTC region in a semiconductor device based on the layout diagram of FTC cell region 216A of FIG. 2A, in accordance with some embodiments.

FIG. 2A uses a similar numbering scheme to that of FIGS. 1A-1B albeit that the former uses 2-series numbers while the latter use 1-series numbers. Taking into consideration the noted number-series differences, features in FIG. 2A that are similar to features in FIGS. 1A-1B use similar numbers. For example, item 214 is FIG. 2A is an ACB region that is similar to ACB region 114 in FIG. 1B. The discussion will focus on differences of FIG. 2B with respect to FIGS. 1A-1B rather than on similarities between the former and the latter.

In general, a layout diagram represents a semiconductor device. Shapes in the layout diagram represent corresponding components in the semiconductor device. The layout diagram per se is a top view. Shapes in the layout diagram are two-dimensional relative to, e.g., the X-axis and the Y-axis, whereas the semiconductor device being represented is three-dimensional. Typically, relative to the Z-axis, the semiconductor device is organized as a stack of layers in which are located corresponding structures, i.e., to which belong corresponding structures. Accordingly, each shape in the layout diagram represents, more particularly, a component in a corresponding layer of the corresponding semiconductor device. Typically, the layout diagram represents relative depth, i.e., positions along the Z-axis, of shapes and thus layers by superimposing a second shape on a first shape so that the second shape at least partially overlaps the first shape. For simplicity of discussion, i.e., as a discussion-expedient, some elements in layout diagram (e.g., FIG. 2A and the other layout diagrams disclosed herein) are referred to as if they are counterpart structures in a corresponding semiconductor device rather than patterns/shapes per se.

Layout diagrams vary in terms of the amount of detail represented. In some circumstances, selected layers of a layout diagram are combined/abstracted into a single layer, e.g., for purposes of simplification. Alternatively, and/or additionally, in some circumstances, not all layers of the corresponding semiconductor device are represented, i.e., selected layers of the layout diagram are omitted, e.g., for simplicity of illustration. FIG. 2A and the other layout diagrams disclosed herein are examples of layout diagrams in which selected layers have been omitted. For example, FIG. 2A and the other layout diagrams disclosed herein omit: the layers of metallization & corresponding layers of interconnection at the frontside of a substrate that includes active regions (ARs); and, with the exception of a first buried metallization (BM_1st) layer, the buried layers of metallization & corresponding buried layers of interconnection at the backside of a substrate that includes active regions (ARs). In some embodiments, the layout diagram of FIG. 2A is part of a larger layout diagram.

In addition to FTC cell region 216A, FIG. 2A further includes cell regions 212(1) and 212(2) which are stacked on each other relative to a first direction, e.g., a direction parallel to the Y-axis. Cell region 212(1) includes a border region 215(1). Cell region 212(2) includes a border region 215(2).

Cell region 212(1) includes an active region (AR) 218(1) at least one-half of which is included in border region 215(1) relative to the second direction (Y-axis). Cell region 212(2) includes an AR 218(2) at least one-half of which is included in border region 215(2) relative to the second direction (Y-axis). A long axis of each of AR regions 218(1)-218(2) extends in the first direction (X-axis). Relative to a second direction (e.g., parallel to the Y-axis) that is perpendicular to the first direction, AR 218(1) is separated from AR 218(2) by a gap 219.

In FIG. 2A, relative the second direction (Y-axis), an ACB region 214 extends from about a top boundary of AR 218(1) to about a bottom boundary of second AR 218(2). ACB region 114 is substantially occupied by FTC region 216A.

Similar to how FIG. 1B serves as an exploded view of active analog block 102(1) and alternatively as an exploded view of interior guard ring block 104(4), cell regions 212 (1)-212(2) of FIG. 2A represent active analog cell regions in an active analog block, e.g., active analog blocks 102(1)-

102(2) of FIG. 1A, or the like, and alternatively represent interior guard ring cell regions in an interior guard ring block, e.g., interior guard ring blocks 104(1)-104(5) of FIG. 1A, or the like.

Cell regions 212(1) and 212(2) include various gate segments 232(x) that have long axes that extend in the second direction (Y-axis). Cell region 212(1) includes: gate segments 232(2)_T, 232(3)_T, 232(4)_T, 232(5)_T, 232(6)_T and 232(7)_T which overlie AR 218(1); and portions of gate segments 231(1) and 232(8) which overlie AR 218(1). Cell region 212(2) includes: gate segments 232(2)_B, 232(3)_B, 232(4)_B, 232(5)_B, 232(6)_B and 232(7)_B which overlie AR 218(2); and portions of gate segments 231(1) and 232(8) which overlie AR 218(2).

ARs 218(1) and 218(2) have corresponding left and right edges relative to the first direction (X-axis). Relative to the first direction (X-axis), gate segment 232(1) is substantially centered over the left edge of each of ARs 218(1) and 218(2). Relative to the first direction (X-axis), gate segment 232(8) is substantially centered over the right edge of each of ARs 218(1) and 218(2).

Cell regions 212(1) and 212(2) have corresponding left and right edges relative to the first direction (X-axis). In some embodiments, a left edge of cell region 212(1) is at or leftward-proximal to the left edge of AR 218(1). In some embodiments, a right edge of cell region 212(1) is at or rightward-proximal to the right edge of AR 218(1). In some embodiments, a left edge of cell region 212(2) is at or leftward-proximal to the left edge of AR 218(2). In some embodiments, a right edge of cell region 212(2) is at or rightward-proximal to the right edge of AR 218(2). In some embodiments, relative to the first direction (X-axis), the left edges of cell regions 212(1) and 212(1) are correspondingly substantially centered over gate segment 232(1) or leftward-proximal to a centerline of, gate segment 232(1). In some embodiments, relative to the first direction (X-axis), the right edges of cell regions 212(1) and 212(1) are correspondingly substantially centered over gate segment 232(8) or rightward-proximal to a centerline of gate segment 232(8).

Gate segments 232(2)_T and 232(2)_B are aligned relative to the first direction (X-axis) as a pair of gate segments. Similarly, 232(3)_T & 232(3)_B, 232(4)_T & 232(4)_B, 232(5)_T & 232(5)_B, 232(6)_T & 232(6)_B and 232(7)_T & 232(7)_B are aligned as corresponding pairs of gate segments. Portions of each member of each pair of gate segments are included in FTC region 216A. In some embodiments, one or more of the pairs of gate segments 232(2)_T & 232(2)_B, 232(3)_T & 232(3)_B, 232(4)_T & 232(4)_B, 232(5)_T & 232(5)_B, 232(6)_T & 232(6)_B and 232(7)_T & 232(7)_B is replaced by a corresponding gate segment that extends continuously across AR 218(1), gap 219 and AR 218(2).

In FIG. 2A, relative to the second direction (Y-axis): portions of each of gate segments 232(2)_T, 232(3)_T, 232(4)_T, 232(5)_T, 232(6)_T and 232(7)_T extend downwardly a predetermined distance beyond AR 218(1) into gap 219 are referred to herein as gate extensions thereof; and portions of each of gate segments 232(2)_B, 232(3)_B, 232(4)_B, 232(5)_B, 232(6)_B and 232(7)_B extend upwardly the predetermined distance beyond AR 218(2) into gap 219 and are referred to as gate extensions thereof. In some embodiments, at least a majority of gate segments 232(2)_T, 232(3)_T, 232(4)_T, 232(5)_T, 232(6)_T and 232(7)_T have gate extensions. In some embodiments, at least a majority of gate segments 232(2)_B, 232(3)_B, 232(4)_B, 232(5)_B, 232(6)_B and 232(7)_B have gate extensions. In some embodiments, each gate extension facilitates an electrical coupling between the gate segment of which it is a part and the underlying portion of the corresponding AR. For example, the gate extension of facilitates the electrical coupling of gate segment 232(2)_T and underlying portion of AR 218(1). In some embodiments, the length of the gate extensions, i.e., the predetermined distance beyond the AR that the gate extension extends in gap 219, is determined according to the design rules and scale of the corresponding semiconductor process technology node by which a semiconductor device based on FTC region 216A is fabricated.

Cell regions 218(1) and 218(2) have corresponding top and bottom edges relative to the second direction (Y-axis). In some embodiments, relative to the second direction (Y-axis), a bottom edge of cell region 212(1) is downward-proximal to the bottom edges of the gate extensions of gate segments 232(2)_T, 232(3)_T, 232(4)_T, 232(5)_T, 232(6)_T and 232(7)_T. In some embodiments, relative to the second direction (Y-axis), a top edge of cell region 212(2) is upward-proximal to the top edges of the gate extensions of gate segments 232(2)_B, 232(3)_B, 232(4)_B, 232(5)_B, 232(6)_B and 232(7)_B. In some embodiments in which at least a majority of gate segments 232(2)_T, 232 (3)_T, 232(4)_T, 232(5)_T, 232(6)_T and 232(7)_T have gate extensions and at least a majority of gate segments 232(2)_B, 232(3)_B, 232(4)_B, 232(5)_B, 232(6)_B and 232(7)_B have gate extensions, a boundary between cell region 212(1) and 212(2) relative to the second direction (Y-axis) (Y-boundary) is approximately at a midpoint between a bottom edge of AR 218(1) and a top edge of AR 218(2), where the Y-boundary corresponds to a bottom edge of cell 212(1) and a top edge of cell 212(2). In some embodiments, such a Y-boundary represents a middle of ACB region 214 relative to the second direction (Y-axis).

In some embodiments, one or more instances of a gate segment, e.g., gate segment 232(1) and/or 232(8) is/are replaced by an isolation dummy gate (IDG) (not shown). An isolation dummy gate, such as that created from an isolation dummy gate pattern (not shown), is a dielectric structure that includes one or more dielectric materials and functions as an electrical isolation structure. Accordingly, an isolation dummy gate is not a structure that is electrically conductive and so does not function, e.g., as a gate electrode of an active transistor. In some embodiments, an isolation dummy gate is referred to as a dielectric gate structure. In some embodiments, an isolation dummy gate is an example of a structure included in CPODE layout scheme. In some embodiments, CPODE is an acronym for continuous poly on diffusion edge. In some embodiments, CPODE is an acronym for continuous poly on oxide definition edge. In some embodiments, an isolation dummy gate is based on a gate structure as a precursor. In some embodiments, an isolation dummy gate is formed by first forming a gate structure, e.g., a dummy gate structure, sacrificing/removing (e.g., etching) the gate structure to form a trench, (optionally) removing a portion of a substrate that previously had been under the gate structure to deepen the trench, and then filling the trench with one or more dielectric materials such that the physical dimensions of the resultant electrical isolation structure, i.e., the isolation dummy gate, are similar to the dimensions of the precursor which was sacrificed, namely the gate structure or the combination of the gate structure and the portion of the substrate.

In FIG. 2A, cell region 212(1) further includes corresponding portions of metal-to-source/drain region (MD) contact structures 234(2), 234(3), 234(4), 234(5), 234(6), 234(7) and 234(8) that, among other things, overlie AR

218(1). Cell region 212(2) further includes corresponding portions of MD contact structures 234(2), 234(3), 234(4), 234(5), 234(6), 234(7) and 234(8) that, among other things, overlie AR 218(2). FIG. 2A further includes an MD contact structure 234(1) to the left of MD contact structure 234(2) and an MD contact structure 234(9) to the right of MD contact structure 234(8). A long axis of each of MD contact structures 234(1)-234(9) extends in the second direction (Y-axis). Portions of each of MD contact structures 234(1)-234(9) are included in FTC region 216A.

Each of MD contact structures 234(1)-234(9) is a gap-spanning MD contact structures that extends continuously across gap 219. In some embodiments, not everyone of MD contact structures 234(1)-234(9) is a gap-spanning MD contact structure; see FIGS. 2D, 2G, or the like.

Relative to the first direction (X-axis), MD contact structures 234(1)-234(9) are interspersed with the pairs of gate segments. For example, Relative to the first direction (X-axis), MD contact structure 234(4) is between the pair of gate segments 232(3)_T and 232(3)_B and the pair of gate segments 232(4)_T and 232(4)_B.

In FIG. 2A, FTC cell 216A further includes via-to-gate contact structures (VGs) 236 correspondingly centered substantially (relative to the first direction (X-axis)) over gate segments 232(2)_T, 232(3)_T, 232(4)_T, 232(5)_T, 232(6)_T, 232(7)_T, 232(2)_B, 232(3)_B, 232(4)_B, 232(5)_B, 232(6)_B and 232(7)_B. The instances of VG 236 that are over gate segments 232(2)_T, 232(3)_T, 232(4)_T, 232(5)_T, 232(6)_T and 232(7)_T are in cell region 212(1). The instances of VG 236 that are over gate segments 232(2)_B, 232(3)_B, 232(4)_B, 232(5)_B, 232(6)_B and 232(7)_B are in cell region 212(2). Each instance of VG 236 in FIG. 2A is free from overlying each of ARs 218(1) and 218(2). Relative to a proximal side of each of ARs 218(1) and 218(2) which is proximal to gap 219, each instance of VG 236 in FIG. 2A is correspondingly adjacent to a distal side of AR 218(1) or 218(2) which is distal to gap 219.

No instances of VG 236 are over gate segments 232(1) and 232(8). In some embodiments, instances of VG 236 are in different locations than shown in FIG. 2A. In some embodiments, the number of instances of VG 236 is different than is shown in FIG. 2A.

FTC cell 216A further includes via-to-MD contact structures (VDs) 238 correspondingly centered substantially (relative the first direction (X-axis)) over MD contact structures 234(3)-234(7). Three instances of VD 238 are over each of MD contact structures 234(3), 234(5) and 234(7). Regarding each of MD contact structures 234(3), 234(5) and 234(7), one instance of VD 238 is over AR 218(1), one instance of VD 238 is over gap 219 and one instance of VD 238 is over AR 218(2). Four instances of VD 238 are over each of MD contact structures 234(4) and 234(6). Regarding each of MD contact structures 234(4) and 234(6), one instance of VD 238 is over AR 218(1), two instances of VD 238 are over gap 219 and one instance of VD 238 is over AR 218(2). Three instances of VD 238 are partially in each of cells 212(1)-212(1).

No instances of VD 238 are over MD contact structures 234(1), 234(2), 234(8) and 234(9). In some embodiments, instances of VD 238 are in different locations than is shown in FIG. 2A. In some embodiments, the number of instances of VD 238 is different than is shown in FIG. 2A.

In FIG. 2A, some instances of VD 238 are in gap 219. Among the instances of VD 238 in gap 219, some are substantially equidistant between a bottom edge of AR 218(1) and a top edge of AR 218(2) relative to the second direction (Y-axis), examples of which include: the instance of VD 238 in gap 219 which is over MD contact structure 234(3); the instance of VD 238 in gap 219 which is over MD contact structure 234(5); and the instance of VD 238 in gap 219 which is over MD contact structure 234(3).

In some embodiments, a boundary between cell region 212(1) and 212(2) relative to the second direction (Y-axis) (Y-boundary) intersects instances of VD 238 in gap 219 which are substantially equidistant between a bottom edge of AR 218(1) and a top edge of AR 218(2), where the Y-boundary corresponds to a bottom edge of cell 212(1) and a top edge of cell 212(2). In some embodiments, the instances of VD 238 in gap 219 which are substantially equidistant between a bottom edge of AR 218(1) and a top edge of AR 218(2) are also substantially centered on the Y-boundary between cell region 212(1) and 212(2). In some embodiments, such a Y-boundary represents a middle of ACB region 214 relative to the second direction (Y-axis). Among the instances of VD 238 in gap 219, some (1) are over a common MD contact structure and (2) are substantially equidistantly spaced from the Y-boundary between cell region 212(1) and 212(2) relative to the second direction (Y-axis), examples of which include: instances of VD 238 in gap 219 which are over MD contact structure 234(4); and instances of VD 238 in gap 219 which are over MD contact structure 234(6). In some embodiments, such a Y-boundary between represents a middle of ACB region 214 relative to the second direction (Y-axis).

In FIG. 2A, FTC cell 216A further includes via-to-PGBM_1st-segment contact structures (VBs) 228(1)-228(6), each of which has a long axis extending in the second direction (Y-axis). VBs 228(1)-228(3) are in cell region 212(1) and under AR 218(1). VBs 228(4)-228(6) are in cell region 212(2) and under AR 218(2). Relative to the first direction (X-axis): VBs 228(1) and 228(4) are aligned with MD contact structure 234(3); VBs 228(2) and 228(5) are aligned with MD contact structure 234(5); and VBs 228(3) and 228(6) are aligned with MD contact structure 234(7). Each of VBs 228(1)-228(6) also substantially underlies a corresponding instance of VD 238.

Relative to the second direction (Y-axis), a length of the long axis of each of VBs 228(1)-228(3) is about the same as a length of a short axis of AR 218(1). Relative to the second direction (Y-axis), a length of the long axis of each of VBs 228(4)-228(6) is about the same as a length of a short axis of AR 218(2). In some embodiments, relative to the second direction (Y-axis), the length of the long axis of each of VBs 228(1)-228(6) is about the same as a length of the short axis of each of ARs 218(1)-218(2).

No instances of VB are over MD contact structures 234(1), 234(2), 234(8) and 234(9). In some embodiments, VBs 228(4)-228(6) are in different locations than is shown in FIG. 2A. In some embodiments, the number of instances of VB is different than is shown in FIG. 2A.

In FIG. 2A, FTC cell 216A further includes a PG segment in a first buried metallization (BM_1st) layer (PGBM_1st segment) 230A under the VBs. In some embodiments, depending upon the numbering convention of the corresponding process node by which a semiconductor device based on FTC region 216A is fabricated, the BM_1st layer is either buried metallization layer zero, BM0, or buried metallization layer one, BM1, and correspondingly the first layer of buried interconnection BV_1st (not shown) is either BVIA0 or BVIA1. In FIG. 2A and the other layout diagrams disclosed herein, BM_1st is assumed to be BM0 and BV_1st is assumed to be VIA0.

Relative to the second direction (Y-axis): PGBM_1st segment 230A underlaps at least a majority of each of VBs 228(1)-228(6); and is substantially coextensive with ACB region 214 except for a first non-underlapped area between a top edge of PGBM_1st segment 230A and the top boundary of AR 218(1) and a second non-underlapped area between a bottom edge of PGBM_1st segment 230A and a bottom edge of AR 218(2). In some embodiments, relative to the second direction (Y-axis), PGBM_1st segment 230A is substantially coextensive with ACB region 214, i.e., PGBM_1st segment 230A substantially does not exhibit non-underlapped areas with respect to ARs 218(1)-218(2) such as the corresponding first and second non-underlapped areas noted above. In some embodiments, ACB region 214 is described as having a buried PG segment, i.e., PGBM_1st segment 230A.

In FIG. 2A, PGBM_1st segment 230A is shaped like a cross having a long axis extending in the first direction (X-axis) and a short axis extending in the second direction (Y-axis). The cross shape of PGBM_1st segment 230A has a central portion, referred to herein as a torso portion, from which extend top & bottom and left and right arms. Relative to the second direction (Y-axis), the top and bottom arms of the cross shape of PGBM_1st segment 230A extend parallel to the short axis of PGBM_1st segment 230A. Relative to the first direction (X-axis), the left and right arms of the cross shape of PGBM_1st segment 230A extend parallel to the long axis of PGBM_1st segment 230A. Relative to the top & bottom and left & right arms, the cross shape of PGBM_1st segment 230A has a central portion referred to herein as a torso portion.

Relative to the first direction (X-axis) and the second direction (Y-axis): the top arm of the cross shape of PGBM_1st segment 230A underlaps gate segments 232(2)_T, 232(3)_T, 232(4)_T, 232(5)_T, 232(6)_T and 232(7)_T and MD contact structures 234(2)-234(8); and the bottom arm of the cross shape of PGBM_1st segment 230A underlaps gate segments 232(2)_B, 232(3)_B, 232(4)_B, 232(5)_B, 232(6)_B and 232(7)_B and MD contact structures 234(2)-234(8).

Relative to the first direction (X-axis): the left arm of PGBM_1st segment 230A underlaps gate segment 232(1) and MD contact structure 234(1); and the right arm of PGBM_1st segment 230A underlaps gate segment 232(8) and MD contact structure 234(9).

In some embodiments, the left arm of PGBM_1st segment 230A extends farther to left beyond MD contact structure 234(1) than is shown in FIG. 2A. In some embodiments, the right arm of PGBM_1st segment 230A extends farther to right beyond MD contact structure 234(9) than is shown in FIG. 2A.

The torso portion of the cross shape of PGBM_1st segment 230A underlaps MD contact structures 234(2)-234(8). The torso portion of the cross shape of PGBM_1st segment 230A is substantially free of underlapping, i.e., substantially does not underlap gate segments 232(1), 232(2)_T & 232(2)_B, 232(3)_T & 232(3)_B, 232(4)_T & 232(4)_B, 232(5)_T & 232(5)_B, 232(6)_T & 232(6)_B, 232(7)_T & 232(7)_B, and 232(8).

In FIG. 2A, regarding some embodiments, a midline of PGBM_1st segment 230A relative to the second direction (Y-axis) (Y-midline) is at or proximal to a boundary between cell region 212(1) and 212(2) relative to the second direction (Y-axis) (Y-boundary). In some embodiment, the Y-boundary corresponds to a bottom edge of cell 212(1) and a top edge of cell 212(2). In some embodiments, the Y-midline of PGBM_1st segment 230A represents a middle of ACB region 214 relative to the second direction (Y-axis).

Regarding FIG. 2B, cross-section 221B corresponds to section line 2B-2B' in FIG. 2A. Regarding FIG. 2C, cross-section 221C corresponds to section line 2C-2C' in FIG. 2A.

In FIG. 2B, AR 218(1) includes source/drain (S/D) regions 222(1) and 222(2) in AR 218(1). Relative to an initial (first) concentration of positive-type (P-type) and/or negative-type (N-type) dopants otherwise present in non-S/D areas of AR 218(1), each of S/D regions 222(1) and 222(2) has a second concentration of positive-type (P-type) and/or negative-type (N-type) dopants which is different than the first concentration. Together, source/drain (S/D) regions 222(1) and 222(2), an area 224 between S/D regions 222(1) and 222(2), and gate segment 232(2) comprise a transistor 226, where area 224 represents an invertible region commonly referred to as a channel region. In some embodiments, transistor 226 is an FET. In some embodiments, transistor 226 more specifically is a MOSFET. In some embodiments, transistor 226 is a type of transistor other than an FET.

Regarding FIG. 2B, no AR is present in gap 219, i.e., neither AR 218(1) nor AR 218(2) is present in gap 219. Accordingly, relative to a third direction (e.g., Z-axis) perpendicular to each of the first direction (X-axis) and the second direction (Y-axis), the layer occupied by AR 218(1) in FIG. 2B is shown as substrate 217 in FIG. 2C.

In FIG. 2B, cross-section 221B further includes a conductive segment 240(1) in a first metallization (M_1st) layer (M_1st segment). M_1st segment 240(1) is over an instance of VD 238. A long axis of M_1st segment 240(1) extends in the second direction (Y-axis) similarly to the long axis of MD contact structure 234(4). M_1st segment 240(1) is substantially collinear with MD contact structure 234(3).

In FIG. 2C, cross-section 221C further includes an M_1st segment 240(2) which is over an instance of VD 238. A long axis of M_1st segment 240(2) extends in the second direction (Y-axis) similarly to the long axis of MD contact structure 234(4). M_1st segment 240(2) is substantially collinear with MD contact structure 234(3). In some embodiments, M_1st segments 240(1) and 240(2) are portions of a longer M_1st segment.

In some embodiments, depending upon the numbering convention of the corresponding process node by which a semiconductor device based on cross-sections 221B and 221C is fabricated, the M_1st layer is either metallization layer zero, M0, or metallization layer one, M1, and correspondingly the first layer of interconnection V_1st (not shown) is either VIA0 or VIA1. In FIGS. 2B-2C and the other cross-sections disclosed herein, M_1st is assumed to be M0 and V_1st is assumed to be VIA0.

Regarding FIGS. 2A-2C, examples of size ranges include the following. Sizes are normalized with respect VG 236, where VG 236 has a width W_VG relative to the first direction (X-axis) and a height H_VG relative to the second direction (Y-axis). Typically, VG 236 is substantially square.

In some embodiments, relative to the second direction (Y-axis), each of ARs 218(1)-218(2) has a height, H_AR, in a range as follows: $(\approx((8/3)*H\_VG))\leq H\_AR\leq(\approx((29/6)*H\_VG))$. Relative to the first direction (X-axis), ARs 218(1)-218(2) are sized proportionately to the size of corresponding cell regions 202(1)-202(2).

In some embodiments, relative to the first direction (X-axis), each of gate segments 232(1), 232(2)_T & 232(2)_B, 232(3)_T & 232(3)_B, 232(4)_T & 232(4)_B, 232(5)_T & 232(5)_B, 232(6)_T & 232(6)_B and 232(7)_T & 232(7)_B, and 232(8) has a width, W_GS1, as follows: $W\_GS1\approx((1/4)*W\_VG)$.

Relative to the first direction (X-axis), a distance between two immediately adjacent ones of gate segments 232(1), 232(2)_T & 232(2)_B, 232(3)_T & 232(3)_B, 232(4)_T & 232(4)_B, 232(5)_T & 232(5)_B, 232(6)_T & 232(6)_B and 232(7)_T & 232(7)_B, and 232(8) is uniform and approximately 1.0 CPP, where CPP is a unit of distance-measure. In some embodiments, CCP is an acronym for contacted poly pitch. A value for CPP is determined by the design rules and scale of the corresponding semiconductor process technology node. In such embodiments in which W_GS≈((¼)*W_VG), an example of CPP is as follows: CPP≈(4*W_VG).

In some embodiments, relative to the first direction (X-axis), each of MD contact structures 234(1)-234(9) has a width, V_MD, as follows: W_MD≈((4/3)*W_VG).

In some embodiments, relative to the first direction (X-axis), each VD 238 has a width, V_VD, as follows: ((13/12)*W_VG)≈W_VD. In such embodiments, relative to the second direction (Y-axis), each VD 238 has a height, H_VD, as follows: ((13/12)*H_VG)≈H_VD.

In some embodiments, relative to the second direction (Y-axis), each of VBs 228(1)-228(6) has a height, H_VB, in a range as follows: (≈((8/3)*W_VG))≤W_VB≤(≈((29/6)*H_VG)). In some embodiments, H_VB≈H_AR.

Figure 2D:
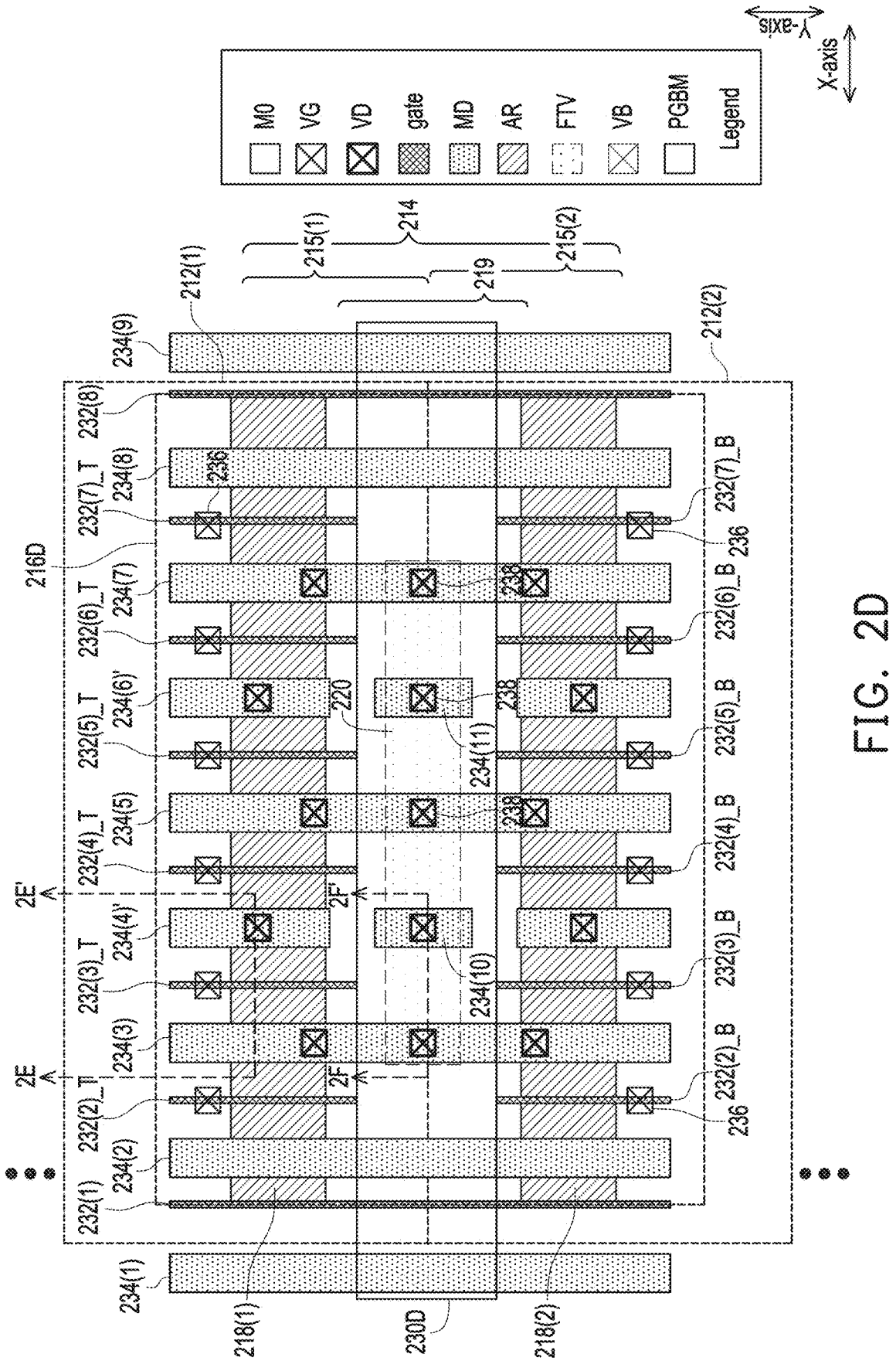

FIG. 2D is a layout diagram of an FTC cell region 216D, in accordance with some embodiments.

Figure 2E:
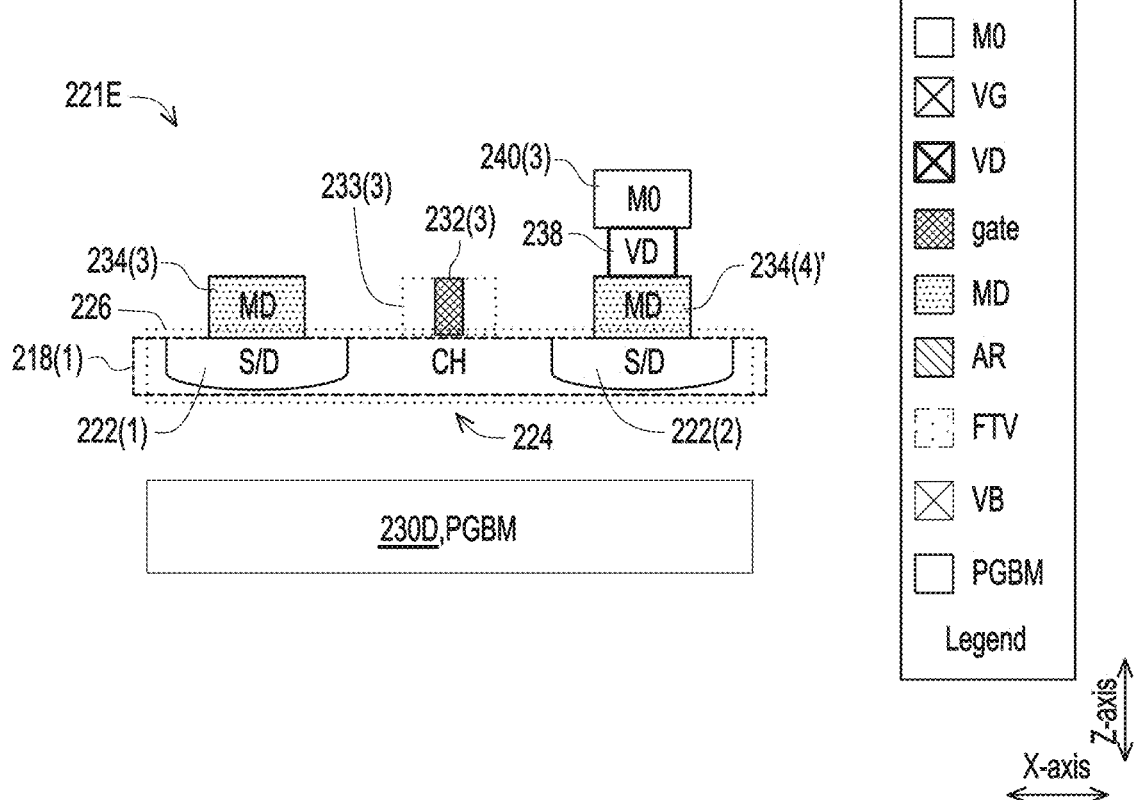
Figure 2F:
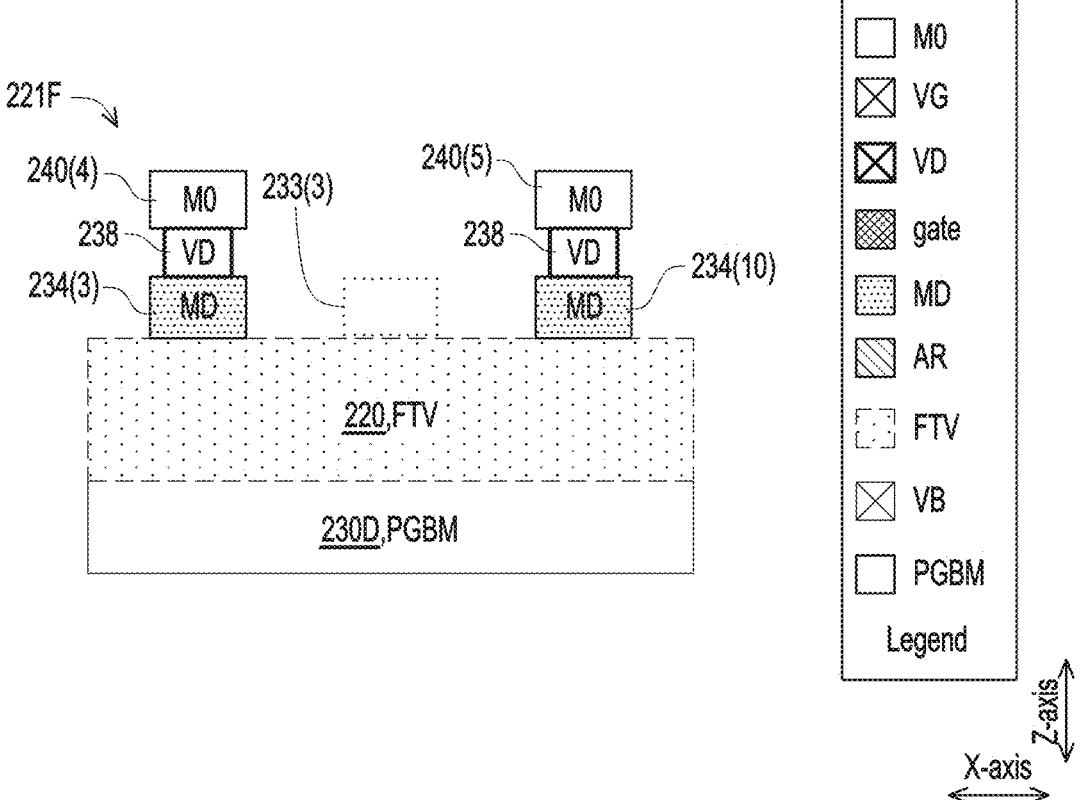

FIGS. 2E-2F are corresponding cross-sections 221E and 221F of an FTC region in a semiconductor device based on the layout diagram of FTC cell region 216D of FIG. 2D, in accordance with some embodiments. Regarding FIG. 2E, cross-section 221E corresponds to section line 2E-2E' in FIG. 2D. Regarding FIG. 2F, cross-section 221F corresponds to section line 2F-2F' in FIG. 2D.

FIGS. 2D-2F are correspondingly similar to FIGS. 2A-2C. The discussion will focus on differences of FIGS. 2D-2F with respect to corresponding FIGS. 2A-2C rather than on similarities between the former and the latter.

Unlike PGBM_1st segment 230A of FIG. 2A, PGBM_1st segment 230A of FIG. 2D is rectangular. Accordingly, in some embodiments, PGBM_1st segment 230A of FIG. 2D is described as having the torso portion and left & right arms of the cross shape of PGBM_1st segment 230A of FIG. 2A but lacking the top & bottom arms of the cross shape of PGBM_1st segment 230A of FIG. 2A. Relative to the second direction (Y-axis), there is a gap between a top edge of PGBM_1st segment 230D and a bottom edge of AR 218(1), and a gap between a bottom edge of PGBM_1st segment 230D and a top edge of AR 218(2). In some embodiments, PGBM_1st segment 230D is described as being free from underlapping each of the ARs 218(1) and 218(2).

In FIG. 2D, regarding some embodiments, a midline of PGBM_1st segment 230D relative to the second direction (Y-axis) (Y-midline) is at or proximal to a boundary between cell region 212(1) and 212(2) relative to the second direction (Y-axis) (Y-boundary). In some embodiment, the Y-boundary corresponds to a bottom edge of cell 212(1) and a top edge of cell 212(2). In some embodiments, the Y-midline of PGBM_1st segment 230D represents a middle of ACB region 214 relative to the second direction (Y-axis).

Unlike FTC 216A of FIG. 2A, FTC 216D of FIG. 2D does not include VBs 228(1)-228(6). but instead includes a feed-through via (FTV) 220. FTV 220 is in gap 219 and over the PGBM_1st segment (230D). FTV 220 has a long axis that extends in the first direction (X-axis).

In FIG. 2D, FTC region 216 further includes MD contact structures 234(10)-234(13).

MD contact structure 234(4) of FIG. 2A has been replaced by a combination of a shorter version thereof, namely MD contact structure 234(4)', and MD contact structures 234(10) and 234(12). MD contact structures 234(4)', 234(10) and 234(12) are substantially collinear. MD contact structure 234(6) of FIG. 2A has been replaced by a combination of a shorter version thereof, namely MD contact structure 234 (6)', and MD contact structures 234(11) and 234(13). MD contact structures 234(6)', 234(11) and 234(13) are substantially collinear.

Relative to the second direction (Y-axis), and in contrast to contact structures 234(4) and 234(6) of FIG. 2A, MD contact structures 234(4)' and 234(6)' overlap AR 218(1) but do not extend substantially beyond the bottom edge of AR 218(1) into gap 219. Relative to the second direction (Y-axis), and in contrast to portion of contact structures 234(4) and 234(6) within cell region 212(2) of FIG. 2A, MD contact structures 234(12) and 234(13) overlap AR 218(2) but do not extend substantially beyond the top edge of AR 218(2) into gap 219.

MD contact structures 234(10) and 234(11) are over FTV 220. Relative to the second direction (Y-axis), each of MD contact structures 234(10) and 234(11) overlaps FTV 220 but does not extend substantially beyond either the top or bottom edges of FTV 220.

Regarding FIGS. 2D-2F, examples of size ranges of components not common to FIGS. 2A-2C include the following. Again, sizes are normalized with respect VG 236.

In some embodiments, relative to the second direction (Y-axis), FTV 220 has a height, H_FTV, in a range as follows: (≈((5/3)*H_VG))≤H_FTV≤(≈((10/3)*H_VG)). In some embodiments, H_FTV ((31/12)*H_VG).

In some embodiments, relative to the first direction (X-axis), FTV 220 has a width sufficient to overlap MD contact structures 234(3), 234(10), 234(5), 234(11) and 234(7). In some embodiments, relative to the first direction (X-axis), FTV 220 has a width sufficient to extend to the left of MD contact structure 234(3) substantially to (or beyond) a left edge of MD contact structure 234(2), or further extend to the left of MD contact structure 234(2) substantially to (or beyond) MD contact structure 234(1), or the like. In some embodiments, relative to the first direction (X-axis), FTV 220 has a width sufficient to extend to the right of MD contact structure 234(7) substantially to (or beyond) a right edge of contact structure 234(8), or further extend to the right of MD contact structure 234(8) substantially to (or beyond) MD contact structure 234(9), or the like.

In FIG. 2D, regarding some embodiments, a midline of FTV 220 relative to the second direction (Y-axis) (Y-midline) is at or proximal to a boundary between cell region 212(1) and 212(2) relative to the second direction (Y-axis) (Y-boundary). In some embodiment, the Y-boundary corresponds to a bottom edge of cell 212(1) and a top edge of cell 212(2). In some embodiments, the Y-midline of FTV 220 represents a middle of ACB region 214 relative to the second direction (Y-axis).

In FIG. 2D, some instances of VD 238 are in gap 219 and are substantially equidistant between a bottom edge of AR 218(1) and a top edge of AR 218(2) relative to the second direction (Y-axis), examples of which include: the instance of VD 238 in gap 219 which is over MD contact structure 234(3); the instance of VD 238 in gap 219 which is over MD contact structure 234(10); the instance of VD 238 in gap 219 which is over MD contact structure 234(5); the instance of VD 238 in gap 219 which is over MD contact structure 234(11); and the instance of VD 238 in gap 219 which is over MD contact structure 234(3).

In some embodiments, a boundary between cell region 212(1) and 212(2) relative to the second direction (Y-axis) (Y-boundary) intersects instances of VD 238 in gap 219 which are substantially equidistant between a bottom edge of AR 218(1) and a top edge of AR 218(2), where the Y-boundary corresponds to a bottom edge of cell 212(1) and a top edge of cell 212(2). In some embodiments, the instances of VD 238 in gap 219 which are substantially equidistant between a bottom edge of AR 218(1) and a top edge of AR 218(2) are also substantially centered on the Y-boundary between cell region 212(1) and 212(2). In some embodiments, such a Y-boundary represents a middle of ACB region 214 relative to the second direction (Y-axis).

In FIG. 2E, cross-section 221E further includes M_1st segment 240(3) which is over an instance of VD 238. A long axis of M_1st segment 240(3) extends in the second direction (Y-axis) similarly to the long axis of MD contact structure 234(4)'. M_1st segment 240(3) is substantially collinear with MD contact structure 234(3)'.

In FIG. 2F, cross-section 221F further includes M_1st segments 240(4) and 240(5) which are over corresponding instances of VD 238. A long axis of M_1st segment 240(4) extends in the second direction (Y-axis) similarly to the long axis of MD contact structure 234(3). A long axis of M_1st segment 240(5) extends in the second direction (Y-axis) similarly to the long axis of MD contact structure 234(10). M_1st segment 240(4) is substantially collinear with MD contact structure 234(3). M_1st segment 240(5) is substantially collinear with MD contact structure 234(10). In some embodiments, M_1st segments 240(3) and 240(5) are portions of a longer M_1st segment.

Each of FIGS. 2E-2F show a gate segment 233(2) in phantom (dashed) lines. Gate segment 233(3) relates to FIGS. 2M-2N and represents a variation of gate segment 232(3).

Figure 2G:
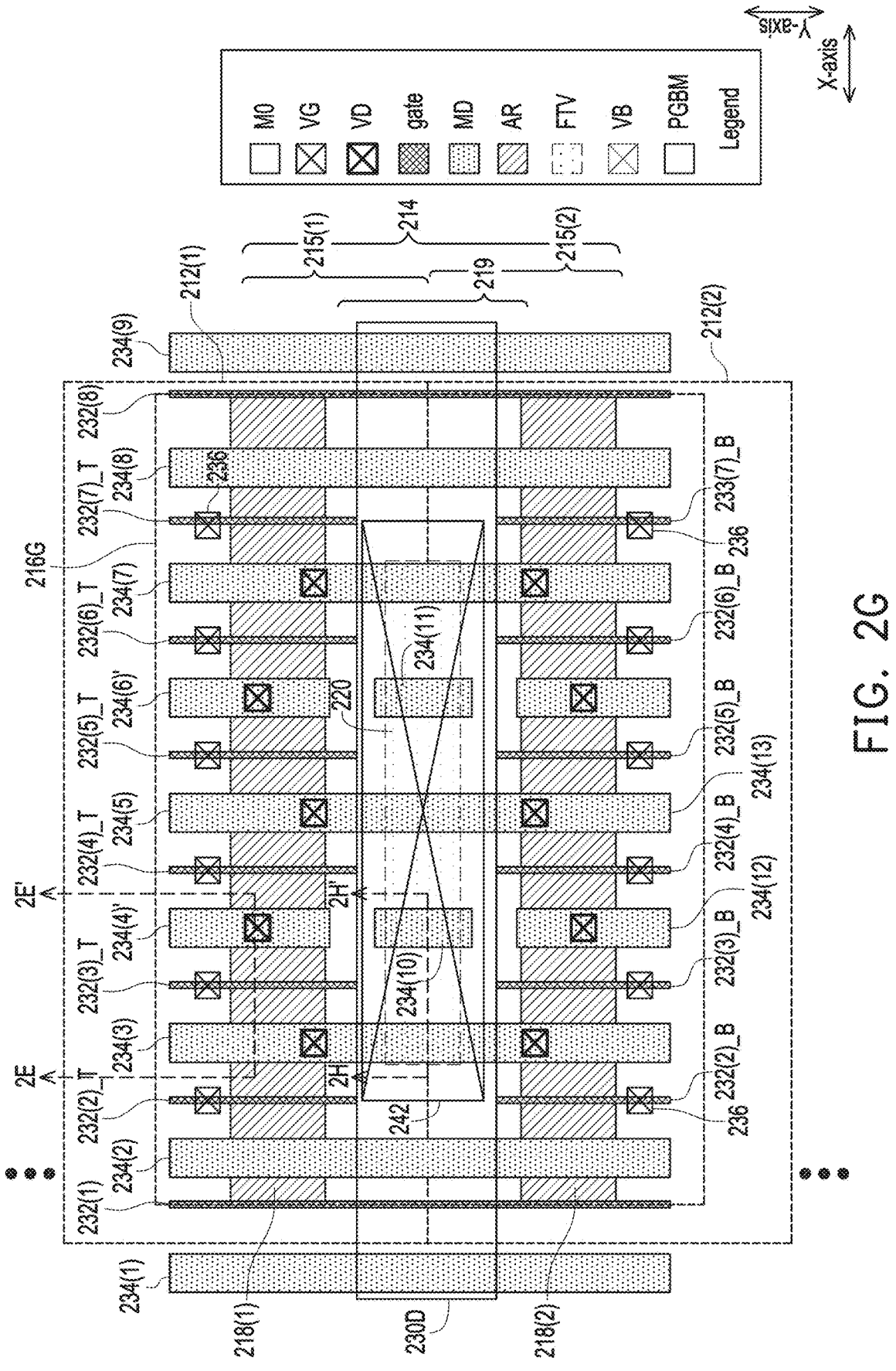

FIG. 2G is a layout diagram of an FTC cell region 216G, in accordance with some embodiments.

Figure 2H:
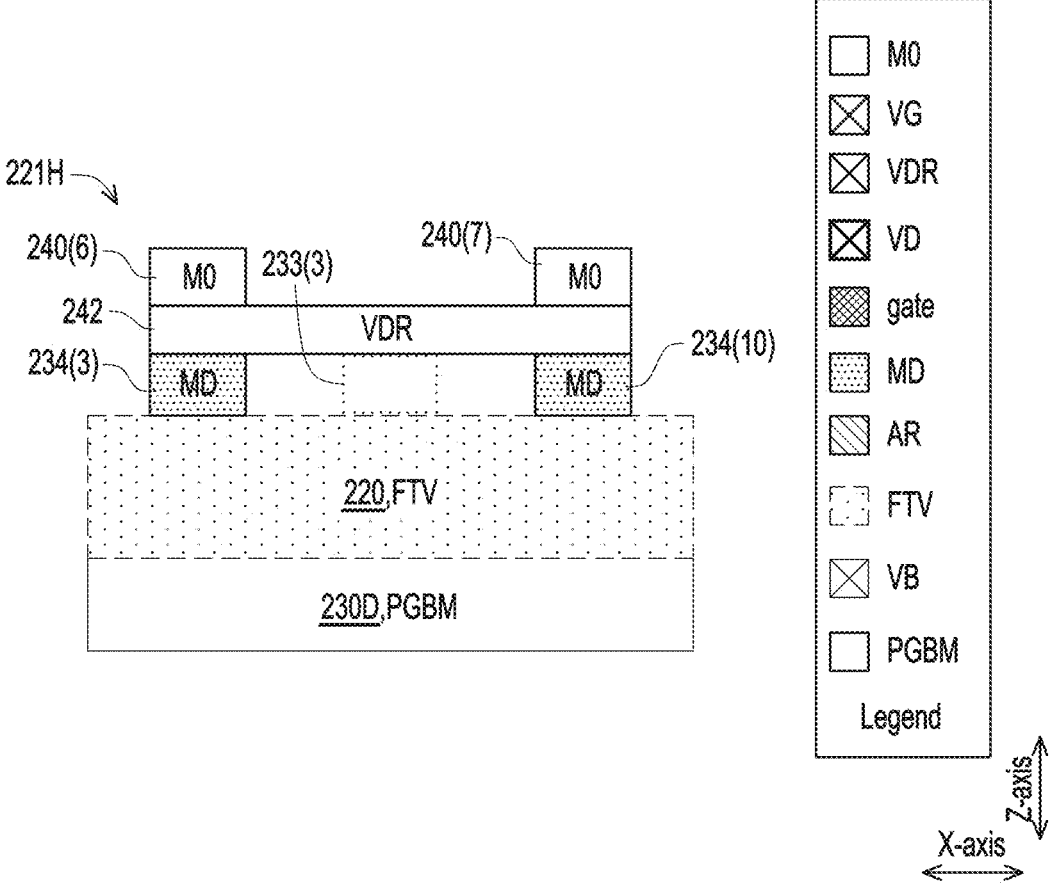
Figure 21:
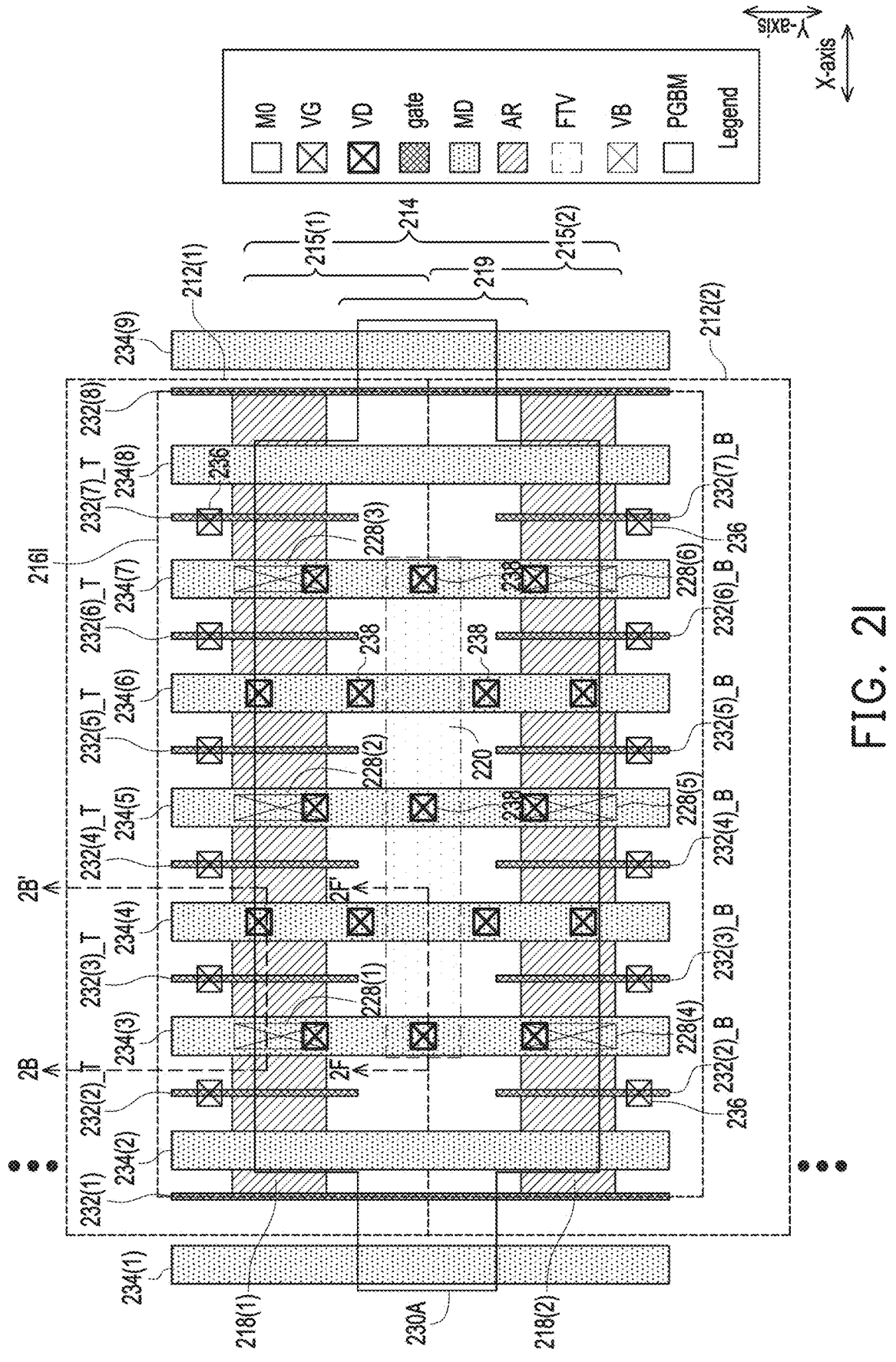

FIG. 2H is cross-section 221H of an FTC region in a semiconductor device based on the layout diagram of FTC cell region 216G of FIG. 2G, in accordance with some embodiments. Regarding FIG. 2H, cross-section 221H corresponds to section line 2H-2H' in FIG. 2G. Similar to FIG. 2D, section line E-E' in FIG. 2G corresponds to cross-section 221E of FIG. 2E.

FIGS. 2G-2H are correspondingly similar to FIGS. 2D and 2F. The discussion will focus on differences of FIGS. 2G and 2H with respect to corresponding FIGS. 2D and 2F rather than on similarities between the former and the latter.

Relative to FTC 216D of FIG. 2D, FTC 216G of FIG. 2G further includes a via-to-MD (VD) rail (VDR) 242. VDR 242 is in gap 219 and over the PGBM_1st segment (230D). A long axis of VDR 242 extends in the first direction (X-axis). Relative to the second direction (Y-axis), VDR 242 is substantially centered on FTV 220. In FIG. 2G, VDR 242 replaces instances of VD 238 that otherwise would be substantially in gap 219 based on similarity of FIG. 2G with respect to FIG. 2D.

In FIG. 2G, regarding some embodiments, a midline of VDR 242 relative to the second direction (Y-axis) (Y-midline) is at or proximal to a boundary between cell region 212(1) and 212(2) relative to the second direction (Y-axis) (Y-boundary). In some embodiment, the Y-boundary corresponds to a bottom edge of cell 212(1) and a top edge of cell 212(2). In some embodiments, the Y-midline of FTV 220 represents a middle of ACB region 214 relative to the second direction (Y-axis).

FIG. 2H shows gate segment 233(3) in phantom (dashed) lines. Gate segment 233(3) relates to FIG. 2N and represents a variation of gate segment 232(3).

In FIG. 2G, relative to the second direction (Y-axis), a height (H_VDR) of VDR 242 is nearly the same as height H_FTV.

In FIG. 2H, cross-section 221H further includes M_1st segments 240(6) and 240(7) which are over corresponding instances of VD 238. A long axis of M_1st segment 240(6) extends in the second direction (Y-axis) similarly to the long axis of MD contact structure 234(3). A long axis of M_1st segment 240(7) extends in the second direction (Y-axis) similarly to the long axis of MD contact structure 234(10). M_1st segment 240(6) is substantially collinear with MD contact structure 234(3). M_1st segment 240(7) is substantially collinear with MD contact structure 234(10). In some embodiments, M_1st segments 240(3) and 240(7) are portions of a longer M_1st segment.

Regarding FIGS. 2G-2H, examples of size ranges of components not common to FIGS. 2A-2F include the following. Again, sizes are normalized with respect to VG 236.

In some embodiments, height (H_VDR) of VDR 242 is in a range as follows: $(\approx((5/6)*H\_VG))\leq H\_VDR\leq(\approx(5*H\_VG))$. In some embodiments, $H\_VDR\approx 2*H\_VG$.

In FIG. 2G, in some embodiments, relative to the first direction (X-axis), VDR 242 has a width sufficient that a left edge of VDR 242 approximately aligns with left edges of corresponding gate segments 232(2)_T and 232(2)_B. In some embodiments, relative to the first direction (X-axis), VDR 242 has a width sufficient that a right edge of VDR 242 approximately aligns with right edges of corresponding gate segments 232(7)_T and 232(7)_B.

In some embodiments, relative to the first direction (X-axis), VDR 242 has a width sufficient to extend to the left of the left edges of corresponding gate segments 232(2)_T and 232(2)_B substantially to (or beyond) a left edge of MD contact structure 234(2), or further extend to the left of MD contact structure 234(2) substantially to (or beyond) a left edge of gate segment 232(1), or further extend to the left of gate segment 232(1) substantially to (or beyond) a left edge of MD contact structure 234(1), or the like.

In some embodiments, relative to the first direction (X-axis), VDR 242 has a width sufficient to extend to the right of the right edges of corresponding gate segments 232(7)_T and 232(7)_B substantially to (or beyond) a right edge of MD contact structure 234(8), or further extend to the right of MD contact structure 234(8) substantially to (or beyond) a right edge of gate segment 232(8), or further extend to the right of gate segment 232(8) substantially to (or beyond) a right edge of MD contact structure 234(9), or the like.

FIG. 2I is a layout diagram of an FTC cell region 216I, in accordance with some embodiments.

FIG. 2I is similar to FIG. 2A, and to a lesser extent is similar to FIG. 2D. Regarding FIG. 2I, section line 2B-2B' corresponds to FIG. 2B and section line 2F-2F' corresponds to FIG. 2F. The discussion will focus on differences of FIG. 2I with respect to FIG. 2A rather than on similarities between the former and the latter.

Relative to FTC cell region 216A of FIG. 2D, FTC cell region 216I of FIG. 2I further includes FTV 220 of FIG. 2D.

Figure 2J:
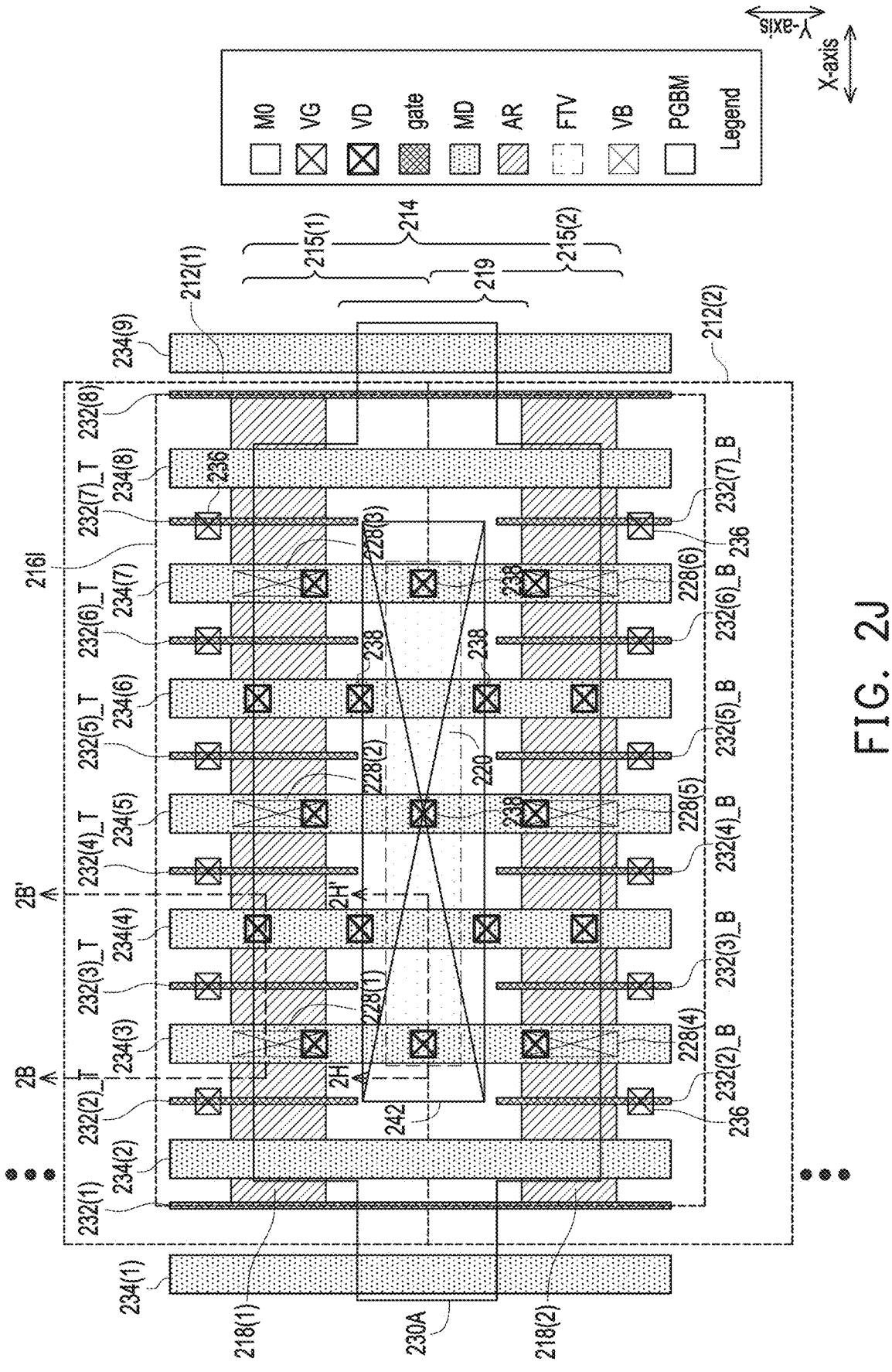

FIG. 2J is a layout diagram of an FTC cell region 216J, in accordance with some embodiments.

FIG. 2J is similar to FIG. 2I. Regarding FIG. 2J, section line 2B-2B' corresponds to FIG. 2B and section line 2H-2H' corresponds to FIG. 2H. The discussion will focus on differences of FIG. 2J with respect to FIG. 2I rather than on similarities between the former and the latter.

Relative to FTC cell region 216A of FIG. 2G, FTC cell region 216J of FIG. 2J further includes FTV 220 and VDR 242 of FIG. 2G. In FIG. 2J, VDR 242 replaces instances of VD 238 that otherwise would be substantially in gap 219 based on similarity of FIG. 2J with respect to FIG. 2I.

Figure 2K:
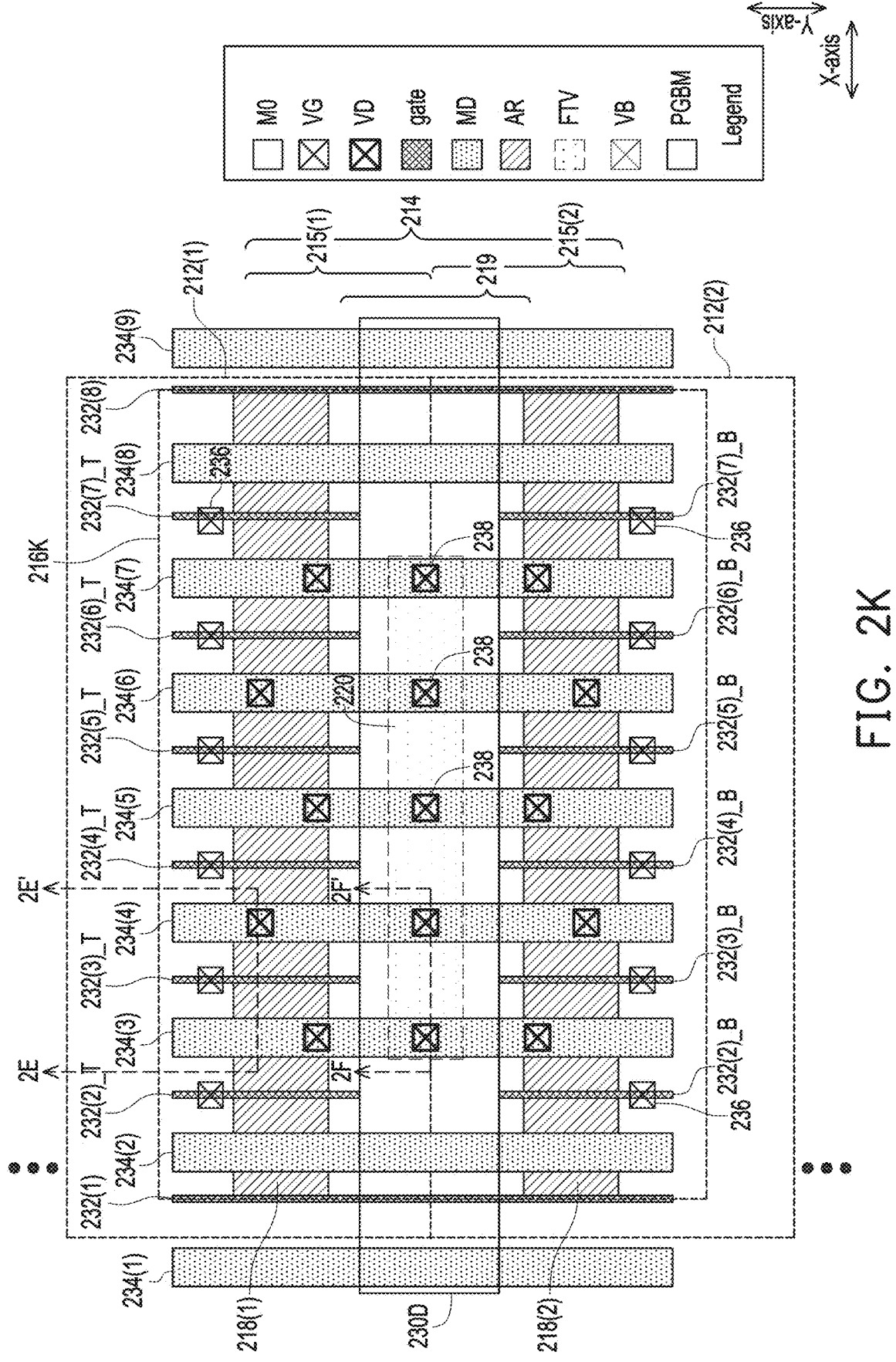

FIG. 2K is a layout diagram of an FTC cell region 216K, in accordance with some embodiments.

FIG. 2K is similar to FIG. 2D. Regarding FIG. 2K, section line 2E-2E' corresponds to FIG. 2E and section line 2F-2F' corresponds to FIG. 2F. The discussion will focus on differences of FIG. 2K with respect to FIG. 2D rather than on similarities between the former and the latter.

In FTC cell region 216K of FIG. 2K: the combination of MD contact structures 234(4)', 234(10) and 234(12) of FTC cell region 216D of FIG. 2D has been replaced with MD contact structure 234(4) of FIG. 2A; and the combination of MD contact structures 234(6)', 234(11) and 234(13) of FTC cell region 216D of FIG. 2D has been replaced with MD contact structure 234(6) of FIG. 2A.

Figure 2L:
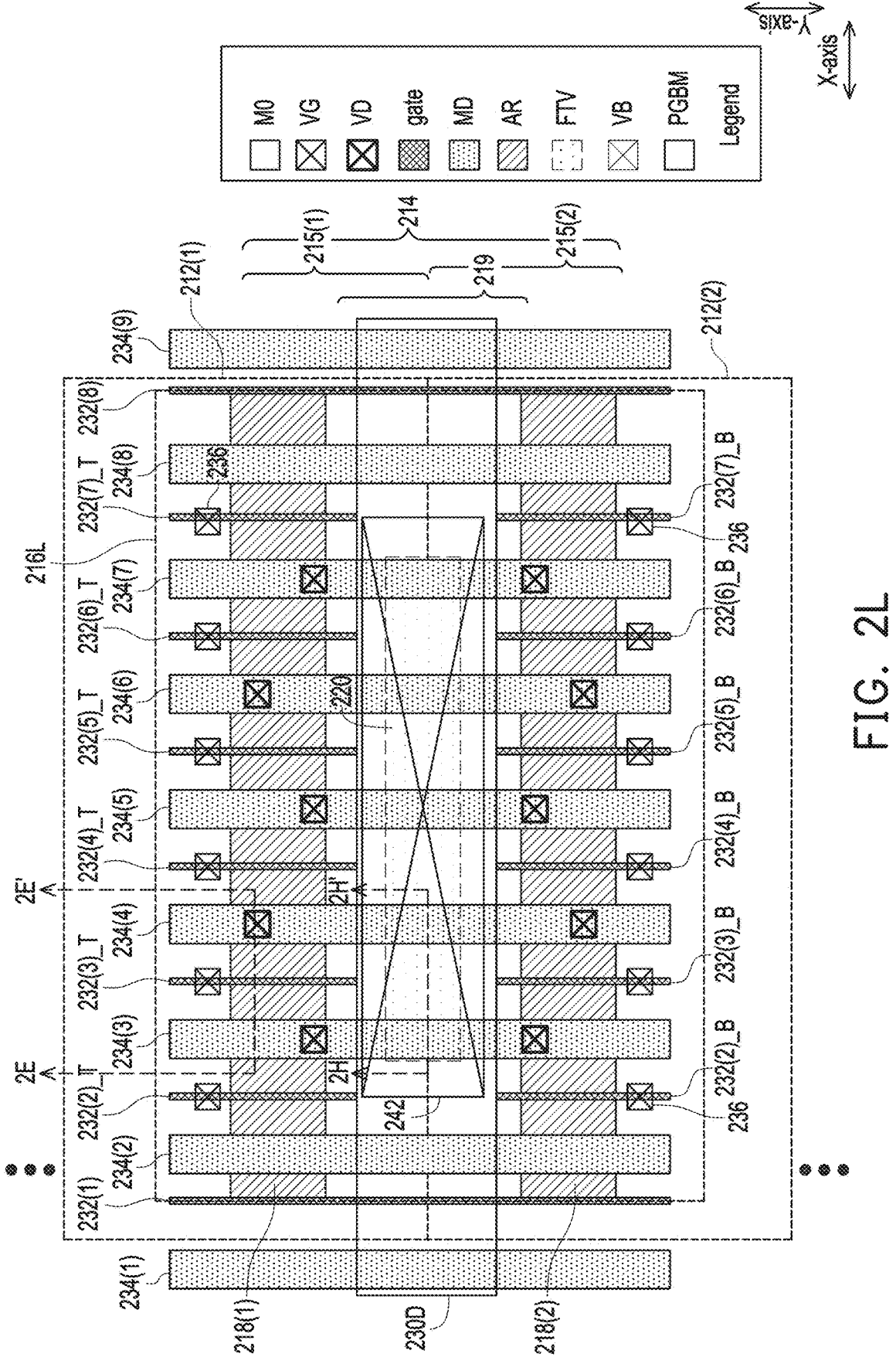

FIG. 2L is a layout diagram of an FTC cell region 216L, in accordance with some embodiments.

FIG. 2L is similar to FIG. 2K. Regarding FIG. 2L, section line 2E-2E' corresponds to FIG. 2E and section line 2H-2H' corresponds to FIG. 2H. The discussion will focus on differences of FIG. 2L with respect to FIG. 2K rather than on similarities between the former and the latter.

In FTC cell region 216L of FIG. 2L: the combination of MG contact structures 234(4)', 234(10) and 234(12) of FTC cell region 216G of FIG. 2G has been replaced with MG contact structure 234(4) of FIG. 2A; and the combination of MG contact structures 234(6)', 234(11) and 234(13) of FTC cell region 216G of FIG. 2G has been replaced with MG contact structure 234(6) of FIG. 2A. In FIG. 2L, VDR 242 replaces instances of VD 238 that otherwise would be substantially in gap 219 based on similarity of FIG. 2L with respect to FIG. 2K.

Figure 2M:
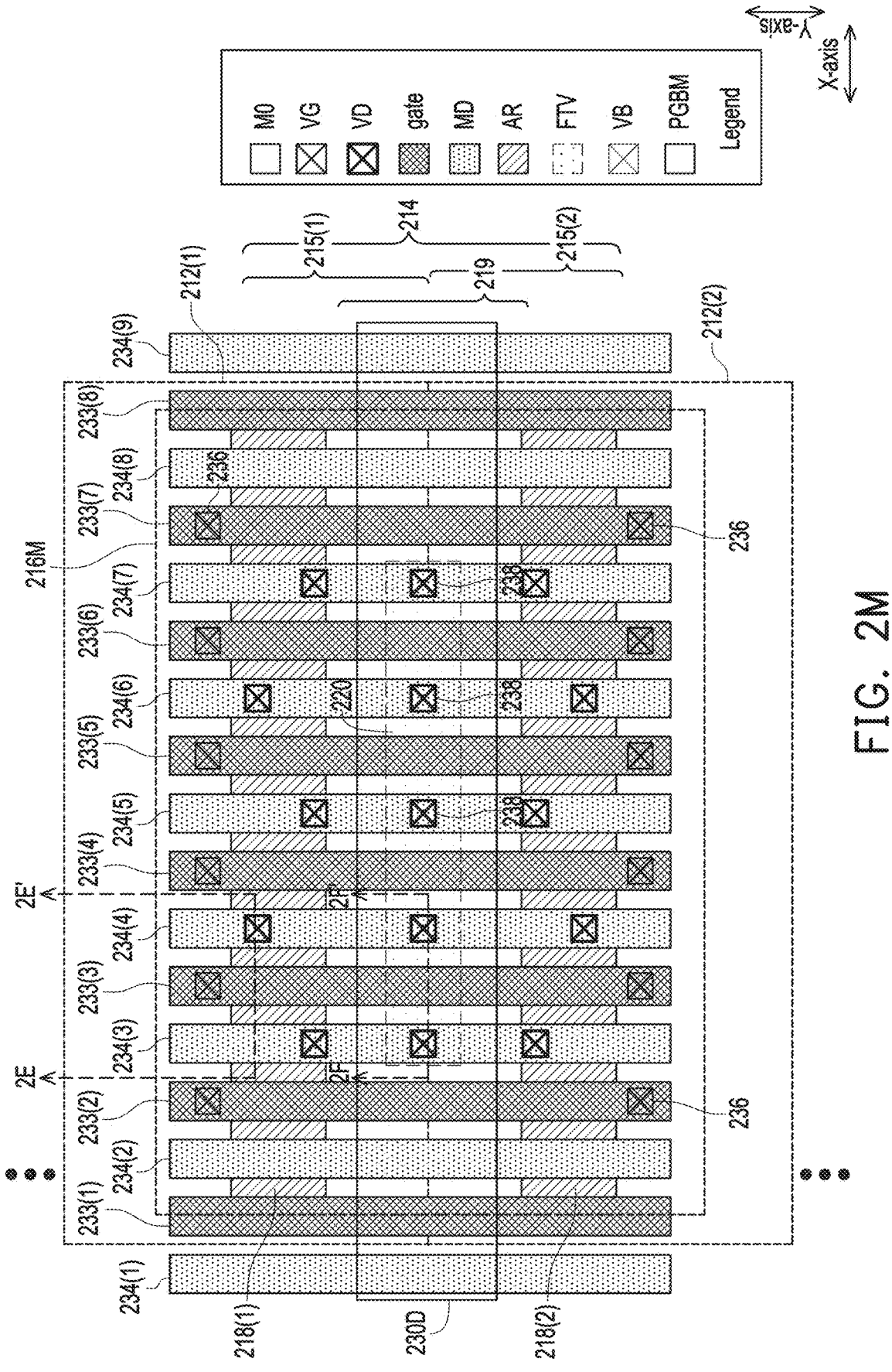

FIG. 2M is a layout diagram of an FTC cell region 216M, in accordance with some embodiments.

FIG. 2M is similar to FIG. 2K. Regarding FIG. 2M, section line 2E-2E' corresponds to FIG. 2E and section line 2F-2F' corresponds to FIG. 2F. The discussion will focus on differences of FIG. 2M with respect to FIG. 2K rather than on similarities between the former and the latter.

In FIG. 2M, the pairs of gate segments 232(2)_T & 232(2)_B, 232(3)_T & 232(3)_B, 232(4)_T & 232(4)_B, 232(5)_T & 232(5)_B, 232(6)_T & 232(6)_B and 232(7)_T & 232(7)_B have been replaced by corresponding gate segments 233(3), 233(4), 233(5), 233(6), 233(7) and 233(8). Each of gate segments 233(3), 233(4), 233(5), 233(6), 233(7) and 233(8) extends continuously across AR 218(1), gap 219 and AR 218(2). Furthermore, the widths of gate segments in FIG. 2M are substantially wider than the widths of gate segments in FIG. 2K, as discussed below.

Regarding FIG. 2M, examples of size ranges of components not common to FIGS. 2A-2L include the following. Again, sizes are normalized with respect VG 236.

In some embodiments, relative to the first direction (X-axis), each of gate segments 233(1)-233(8) has a width, W_GS2, as follows: W_GS2≈ ((11/6)*W_VG). Relative to the first direction (X-axis), in such embodiments in which W_GS≈ ((11/6)*W_VG), an example of CPP is as follows: CPP≈((35/6)*W_VG).

Figure 2N:
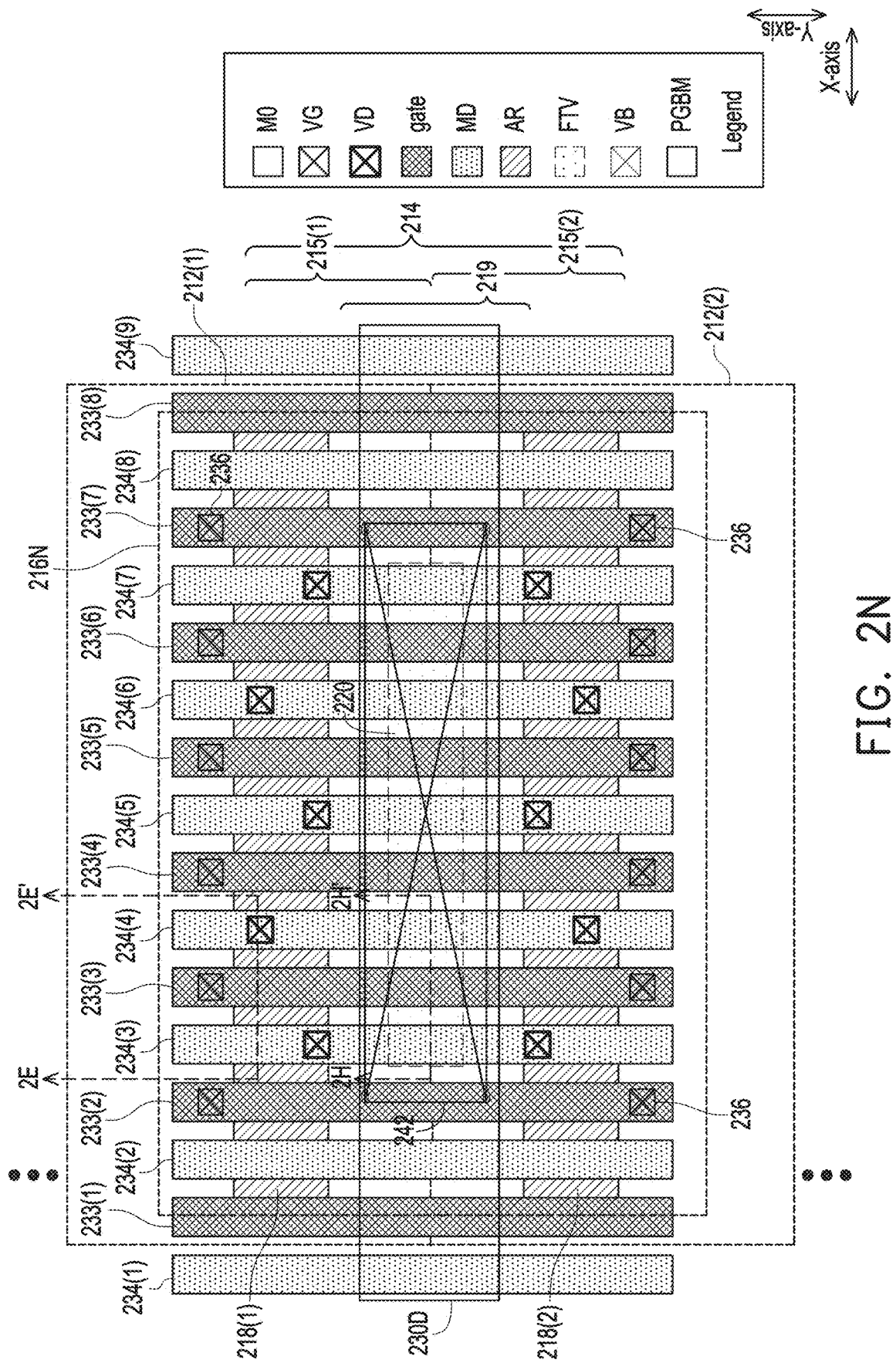
Figure 20:
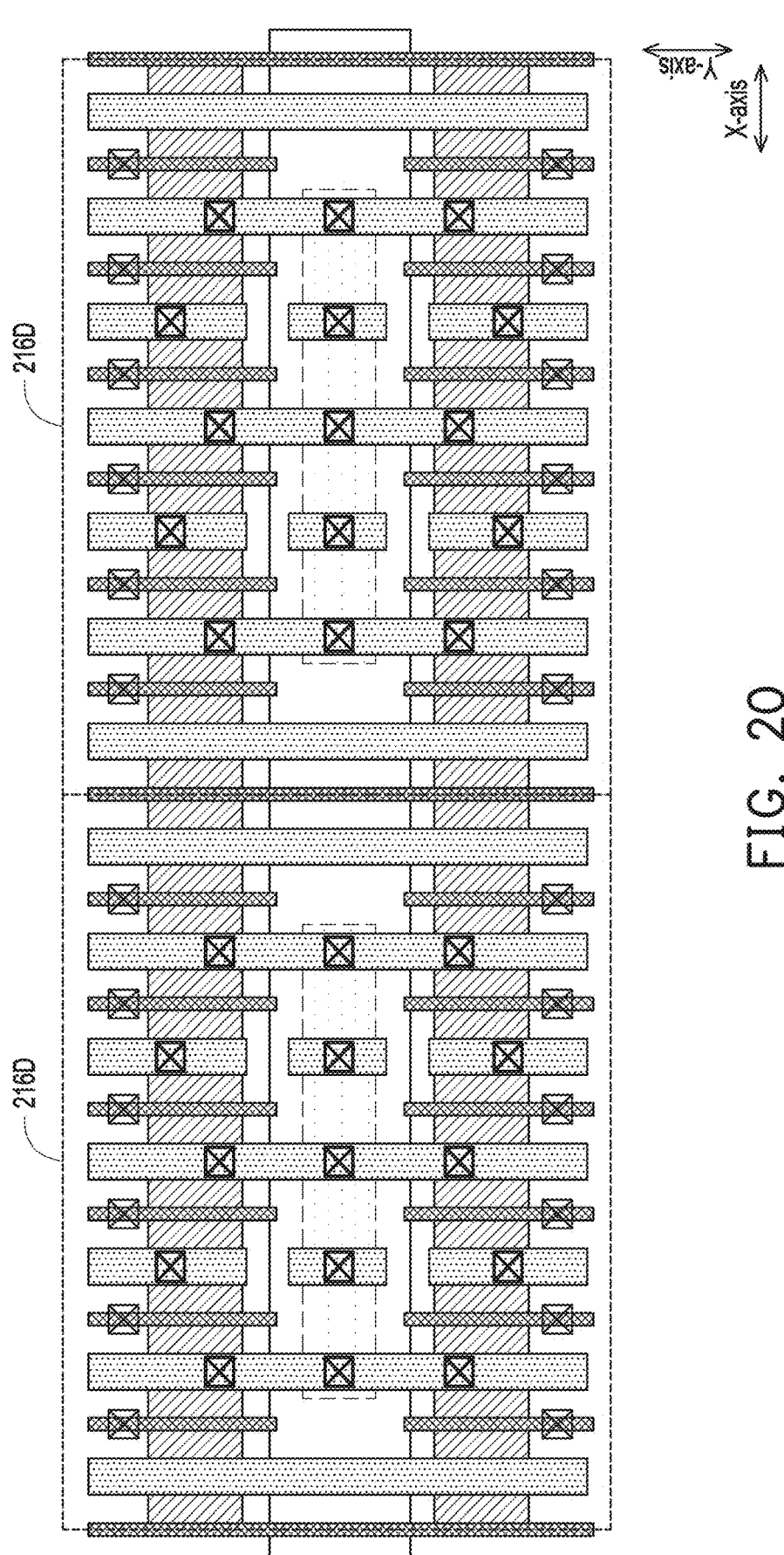

FIG. 2N is a layout diagram of an FTC cell region 216N, in accordance with some embodiments.

FIG. 2N is similar to FIG. 2M, and to a lesser extent is similar to FIG. 2G. Section line E-E' in FIG. 2N corresponds to cross-section 221E of FIG. 2E, and section line H-H' in FIG. 2N corresponds to cross-section 221H of FIG. 2H. Relative to FTC 216M of FIG. 2M, FTC 216N of FIG. 2N further includes VDR 242 of FIG. 2G. In FIG. 2N, VDR 242 replaces instances of VD 238 that otherwise would be substantially in gap 219 based on similarity of FIG. 2N with respect to FIG. 2M.

FIG. 2O is a layout diagram, in accordance with some embodiments.

In FIG. 2O, FTC cell regions 216D of FIG. 2D are abutted against each other relative to the first direction (X-axis).

Figure 2P:
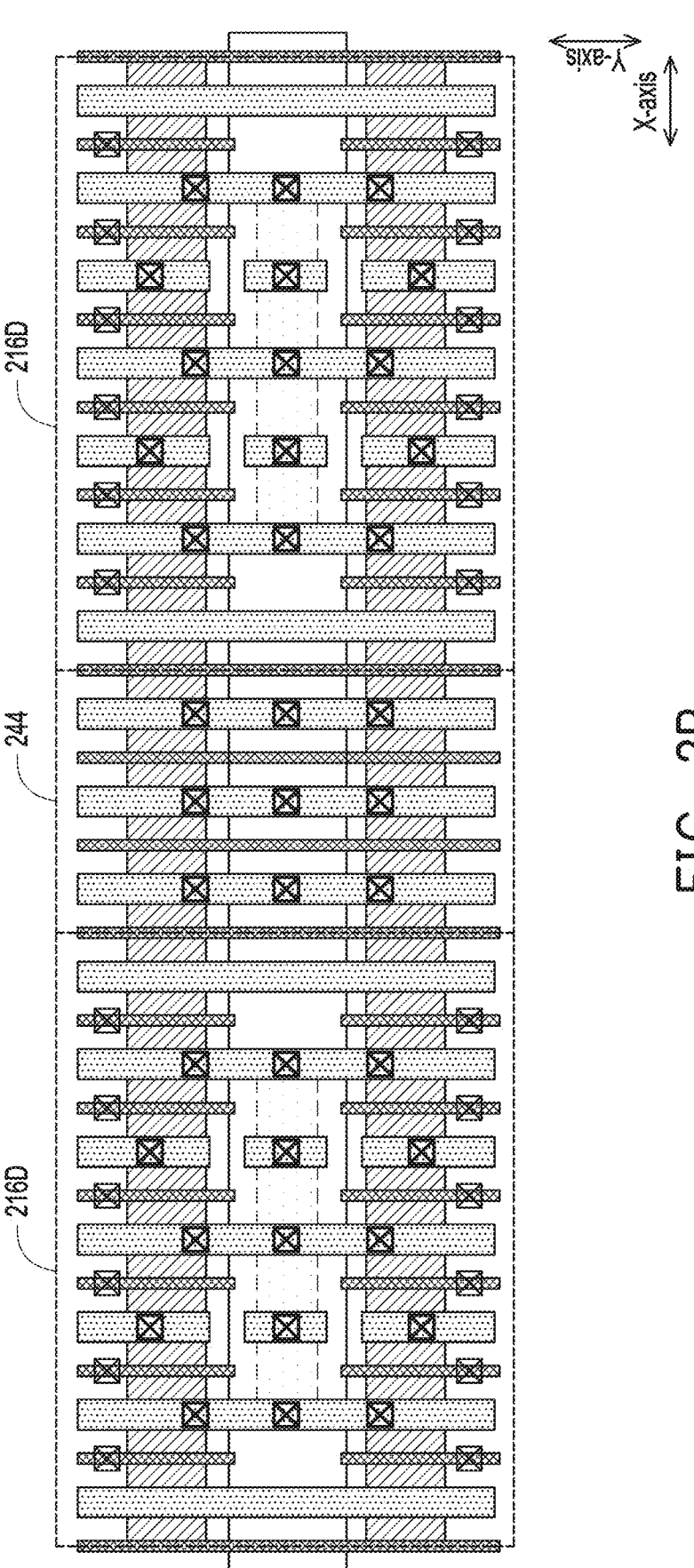

FIG. 2P is a layout diagram, in accordance with some embodiments.

In FIG. 2P, a dummy analog cell 244 is abuttingly between two instances of FTC cell regions 216D of FIG. 2D relative to the first direction (X-axis).

FIG. 2Q is a layout diagram, in accordance with some embodiments.

In FIG. 2Q, an active analog cell 246 is abuttingly between two instances of FTC cell regions 216D of FIG. 2D relative to the first direction (X-axis).

Figure 2R:
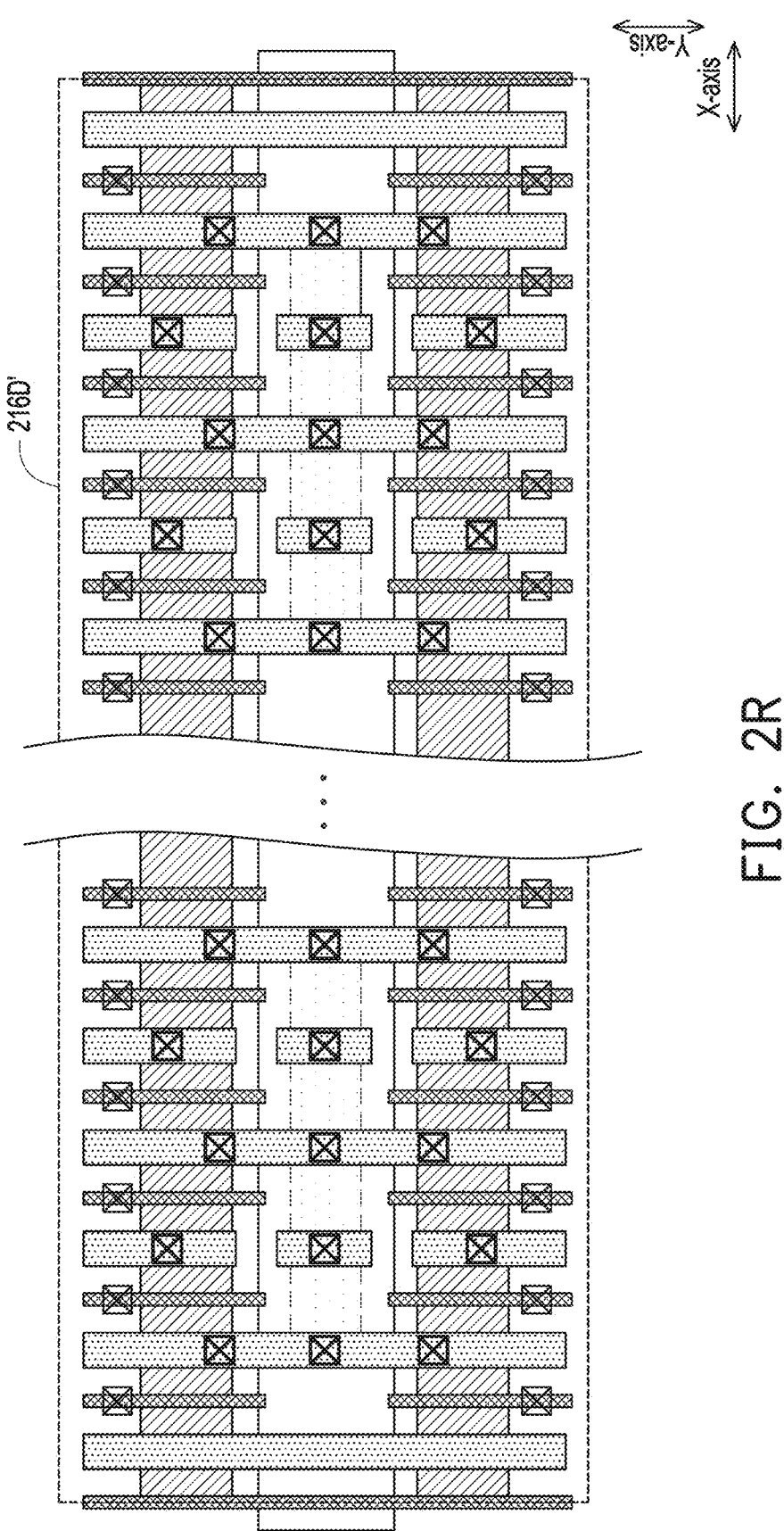
Figure 2S:
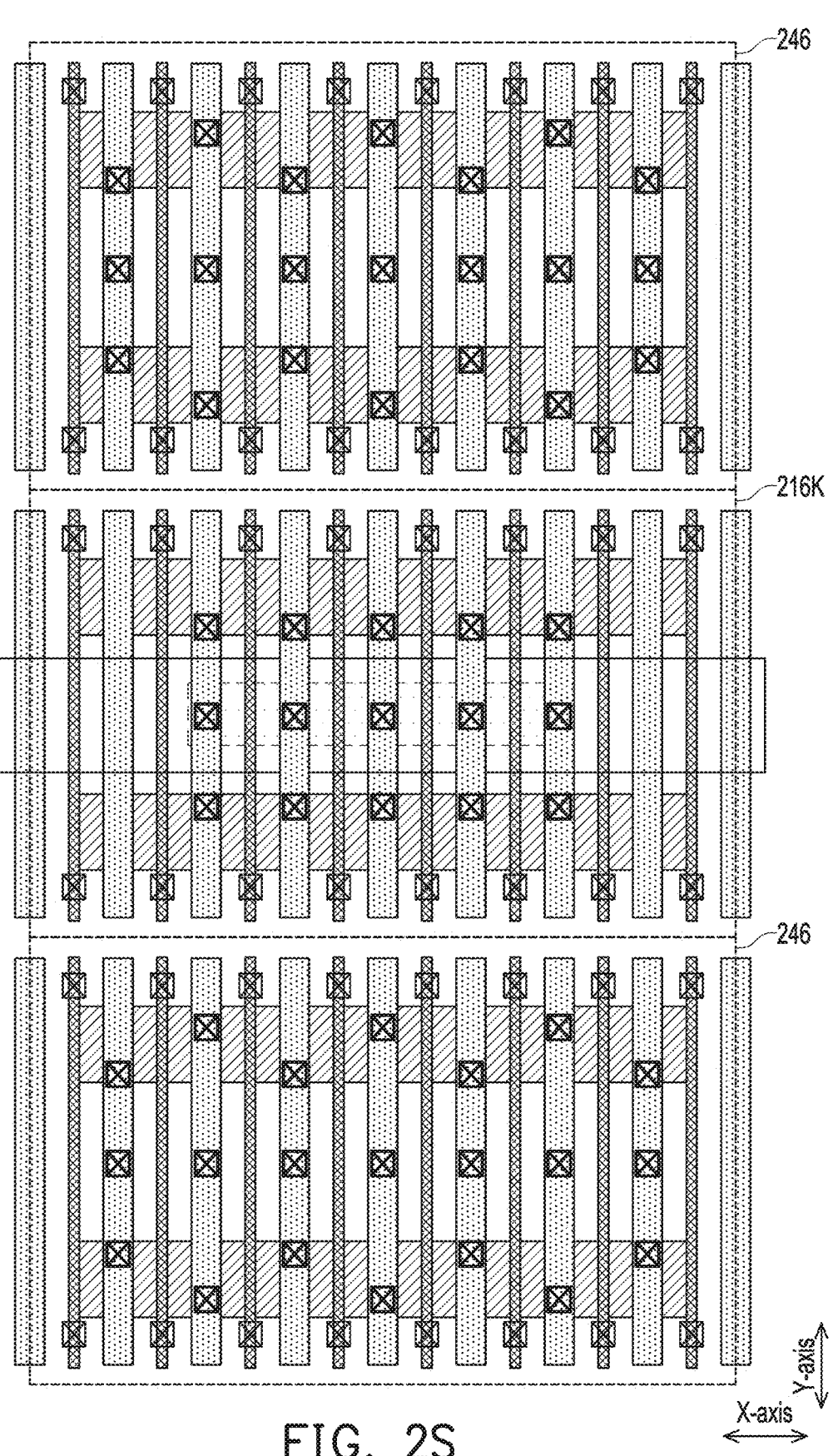

FIG. 2R is a layout diagram, in accordance with some embodiments.

FIG. 2R shows a variant 216' of FTC cell region 216D of FIG. 2D, where FTC cell region 216D' is substantially wider than FTC cell region 216D relative to the first direction (X-axis).

Figure 2T:
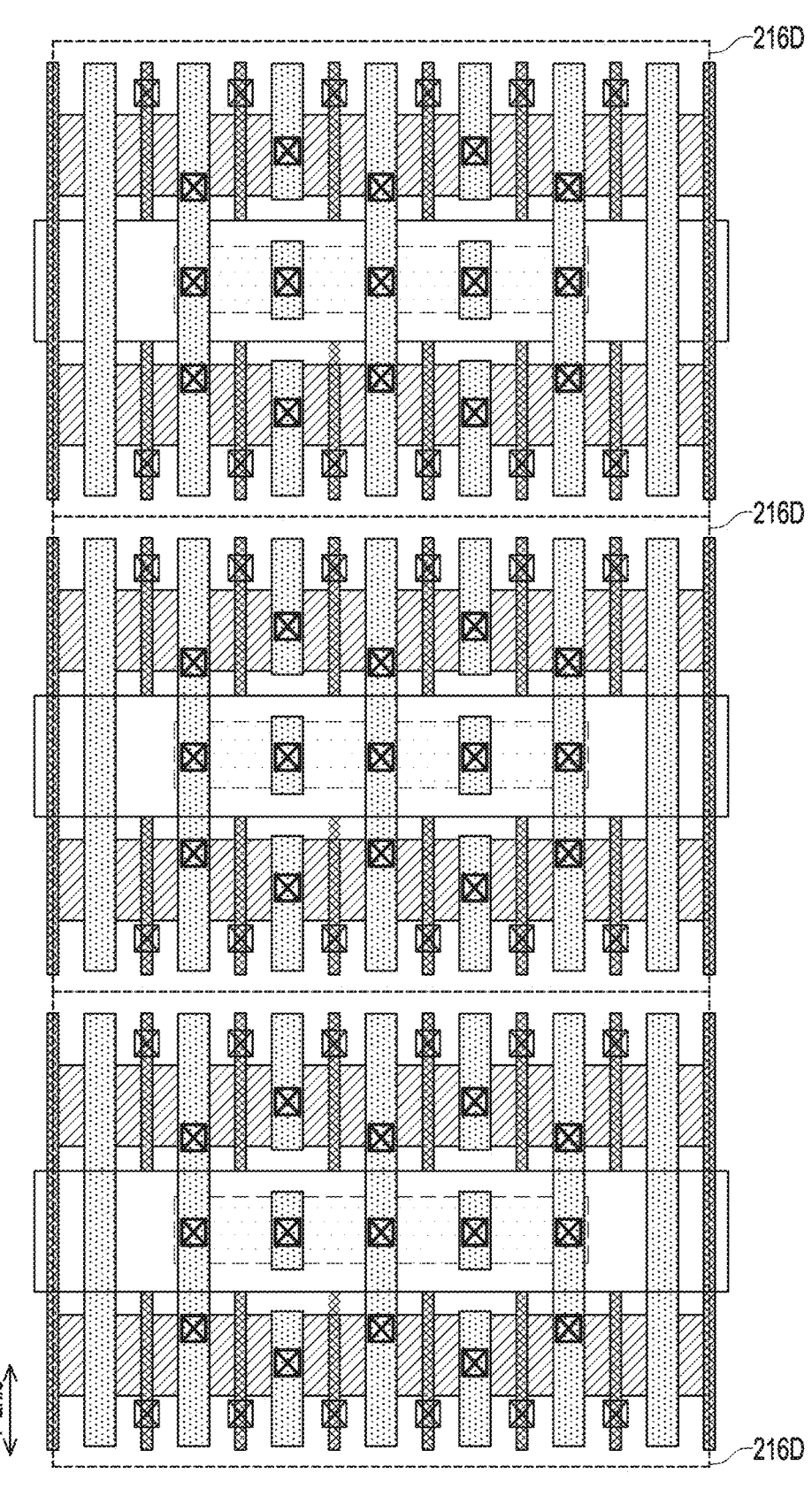

FIG. 2T is a layout diagram, in accordance with some embodiments.

In FIG. 2T, three instances FTC cell region 216D of FIG. 2D are abuttingly stacked on each other relative to the second direction (Y-axis).

Figure 3:
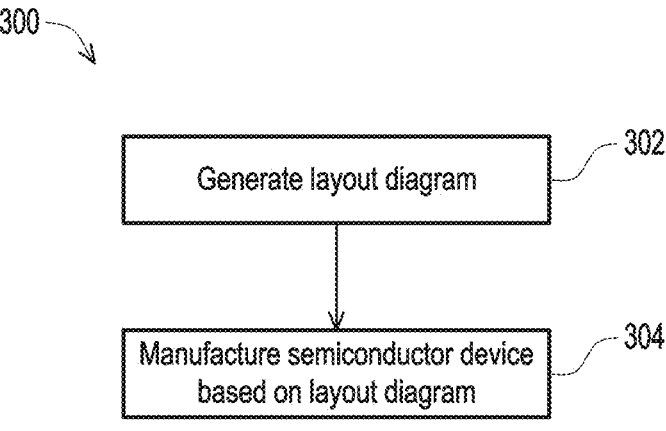
FIGS. 3-4 are corresponding flow diagrams of corresponding methods manufacturing a semiconductor device, in accordance with some embodiments.

FIG. 3 is a flow diagram 300 of a method of manufacturing a semiconductor device, in accordance with some embodiments.

The method of flowchart (flow diagram) 300 is implementable, for example, using EDA system 500 (FIG. 5, discussed below) and an IC manufacturing system 600 (FIG. 6, discussed below), in accordance with some embodiments. Examples of a semiconductor device which can be manufactured according to the method of flowchart 300 include the semiconductor device of FIG. 1, semiconductor devices based on the layout diagrams disclosed herein, semiconductor devices based on the cross-sections disclosed herein, or the like.

In FIG. 3, the method of flowchart 300 includes blocks 302-304. At block 302, a layout diagram is generated which, among other things, includes one or more of layout diagrams disclosed herein, or the like. Block 302 is implementable, for example, using EDA system 500 (FIG. 5, discussed below), in accordance with some embodiments. From block 302, flow proceeds to block 304.

At block 304, based on the layout diagram, at least one of (A) one or more photolithographic exposures are made or (B) one or more semiconductor masks are fabricated or (C) one or more components in a layer of a semiconductor device are fabricated. See discussion below of IC manufacturing system 600 in FIG. 6 below.

Figure 4:
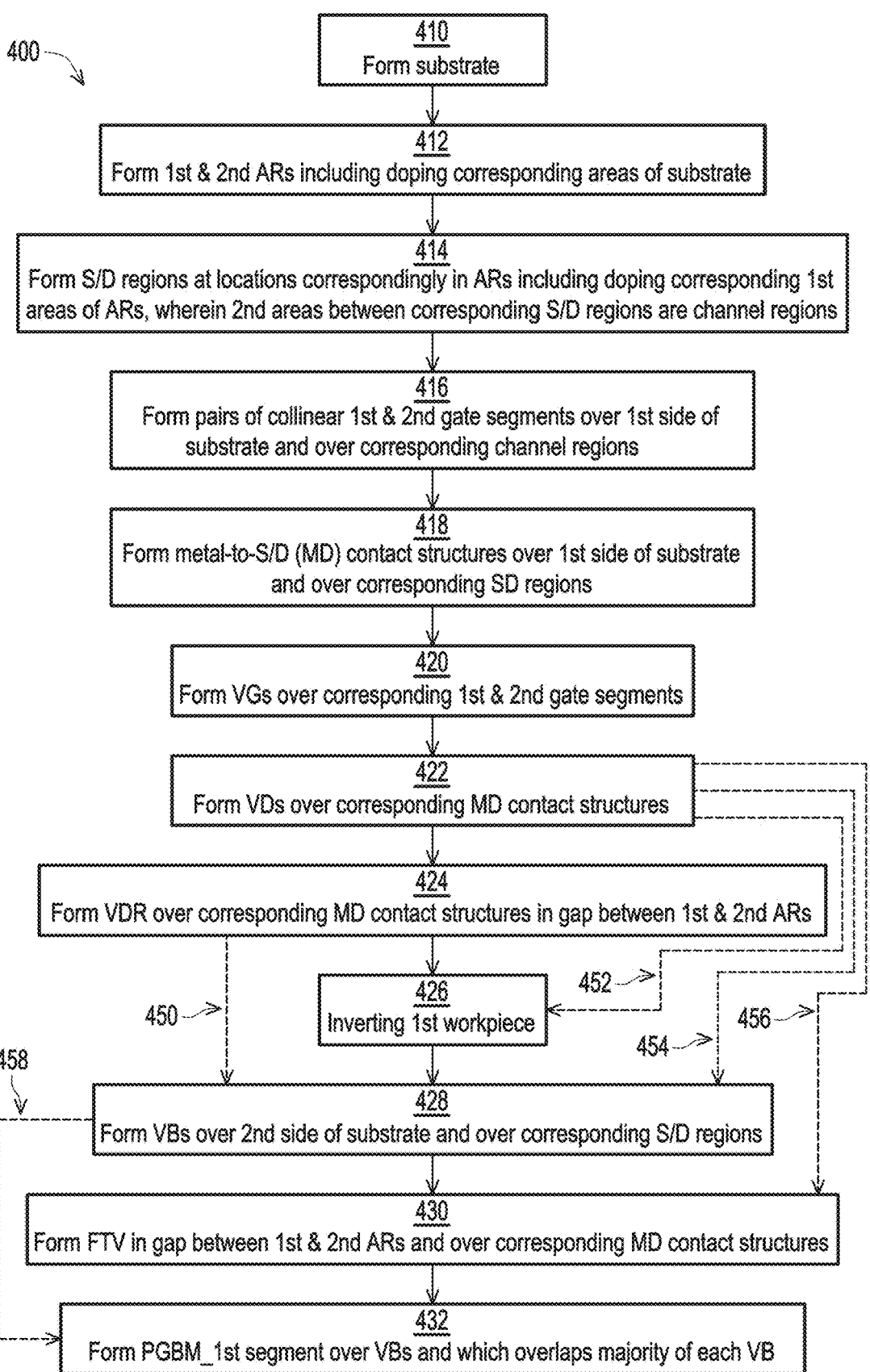

FIG. 4 is a flowchart 400 of a method of fabricating a semiconductor device, in accordance with some embodiments.

The method of flowchart 400 is implementable, for example, using IC manufacturing system 600 (FIG. 6, discussed below), in accordance with some embodiments. Examples of a semiconductor device which can be manufactured according to the method of flowchart 400 include the semiconductor device of FIG. 1, semiconductor devices based on the layout diagrams disclosed herein, semiconductor devices based on the cross-sections disclosed herein, or the like.

Method 400 includes blocks 410-432. At block 410, a substrate is formed. An example of the substrate is substrate 217 of FIG. 2C, or the like. From block 410, flow proceeds to block 412.

At block 412, first and second active regions (ARs) are formed in corresponding areas of the substrate. Examples of the ARs, include ARs 218(1)-218(2) of FIGS. 2A-2N, or the like. From block 412, flow proceeds to block 414.

At block 414, S/D regions are formed in locations in the first and second ARs including doping areas of the ARs, wherein second areas between corresponding S/D regions are channel regions. Examples of the ARs include S/D regions 222(1)-222(2) of FIG. 2B, or the like. An example of a channel region is channel region 224 of FIG. 2B, or the like. From block 414, flow proceeds to block 416.

At block 416, pairs of collinear first & second gate segments are formed over a first side of the substrate and over corresponding channel regions. Examples of the gate segments include pairs 232(2)_T & 232(2)_B, 232(3)_T & 232(3)_B, 232(4)_T & 232(4)_B, 232(5)_T & 232(5)_B, 232(6)_T & 232(6)_B and 232(7)_T & 232(7)_B of FIG. 2A which are formed on a frontside of substrate 217, or the like.

In some embodiments, a single longer gate segment is formed instead of each of the pairs of first and second gate segments. The single gate segment is over each of the first and second ARs and extends continuously through the gap between the first and second ARs. Examples of single longer gate segment include gate segments 233(2)-233(7) of FIGS. 2M-2N, or the like. In such embodiments, each of the gate segments is substantially wider relative to the first direction (X-axis). Examples of wider gate segment include gate segments 233(1)-233(8) of FIGS. 2M-2N, or the like. From block 416, flow proceeds to block 418.

At block 418, MD contact structures are formed over the first side of the substrate and over corresponding S/D regions. Each of the MD contact structures is over each of the first and second ARs and extends continuously through the gap between the first and second ARs.

Examples of the MD contact structures include MD contact structures 234(2)-234(8) of FIG. 2A which are formed on the frontside of substrate 217, or the like.

In some embodiments, some but not all of the MD contact structures are replaced with three shorter MD contact structures where: a first of the shorter MD contact structures is over the first AR; a second one of the shorter MD contact structures is over a portion of the gap between the first and second ARs; and a third one of the shorter MD contact structures is over the second AR. Examples of the first ones of the shorter MD contact structures are MD contact structures 234(4)' and 234(6)' of FIGS. 2D and 2G, or the like. Examples of the second ones of the shorter MD contact structures are MD contact structures 234(10) and 234(11) of FIGS. 2D and 2G, or the like. Examples of the third ones of the shorter MD contact structures are MD contact structures 234(12) and 234(13) of FIGS. 2D and 2G, or the like. From block 418, flow proceeds to block 420.

At block 420, VGs are formed over corresponding gate segments. Examples of the VGs include the instances of VG 236 in FIG. 2A, or the like. From block 420, flow proceeds to block 422.

At block 422, VDs are formed over corresponding MD contact structures. Examples of the VDs include the instances of VD 238 in FIG. 2A, or the like. The result of block 422 is a first version of a workpiece.

Based on the first version of the workpiece, appropriate further processing yields any of FTC regions 216A of FIG. 2A, 216D of FIG. 2D, 216G of FIG. 2G, 2161 of FIG. 2I, 216J of FIG. 2J, 216K of FIG. 2K, 216L of FIG. 2L, 216M of FIG. 2M, and 216N of FIG. 2N. From block 422, flow proceeds to block 424.

At block 424, a VDR is formed over corresponding MD contact structures in a gap between the first and second ARs. An example of the gap is gap 219 in FIGS. 2A, 2D, 2G and 2I-2N, or the like. An example of the VDR is VDR 230 in FIGS. 2G, 2H, 2J, 2L and 2N, or the like. The result of block 424 is a second version of a workpiece.

Based on the second version of the workpiece, appropriate further processing yields any of FTC regions 216G of FIG. 2G, 216H of FIG. 2H, 216J of FIG. 2J, and 216N of FIG. 2N. From block 424, flow proceeds to block 426.

At block 426, the workpiece is inverted. Before block 426, the first side of the workpiece was facing upwards and the second side of the workpiece was facing downwards. After block 426, the second side of the workpiece is facing upwards and the first side of the workpiece is facing downwards. Block 426 is included to better exploit effects of gravity on aspects of some processes. From block 426, flow proceeds to block 428.

In some embodiments, flow bypasses block 428 such that flow proceeds from block 424 to block 428, as indicated by alternate flow-arrow 450.

At block 428, VBs are formed over a second side of the substrate. If the path of flow includes block 426, then the VBs are formed over corresponding S/D regions. If the path of flow does not include block 426, then the VBs are formed under corresponding S/D regions. Examples of the VBs include VBs 228(1)-228(6) of FIGS. 2A, 2I and 2J, or the like. From block 428 flow proceeds to block 430.

At block 430, an FTV is formed in the gap between the first and second ARs. If the path of flow includes block 426, then the FTV is formed over corresponding MD contact structures. If the path of flow does not include block 426, then the FTV is formed under corresponding MD contact structures. An example of the FTV includes FTV 220 of FIGS. 2D, 2G, and 2I-2N, or the like.

In some embodiments, a midline of the FTV relative to the second direction (Y-axis) (Y-midline) is at or proximal to a location where the first (e.g., 212(1), or the like) and second (212(2), or the like) analog cell regions abut. The Y-midline of the FTV (e.g., 220, or the like) is at or proximal to a middle of the ACB region (e.g., 214 in FIGS. 2A, 2D, 2G, 2I-2N, or the like). From block 430, flow proceeds to block 432.

At block 432, a PGBM_1st segment is formed at least in the gap between the first and second ARs. If the path of flow includes block 426, then the PGBM_1st segment is formed over corresponding MD contact structures and/or VBs. If the path of flow does not include block 426, then the PGBM_1st segment is formed under corresponding MD contact structures and/or VBs.

In some embodiments, a midline of the PGBM_1st segment relative to the second direction (Y-axis) (Y-midline) is at or proximal to a location where the first (e.g., 212(1), or the like) and second (212(2), or the like) analog cell regions abut. The Y-midline of the PGBM_1st segment (e.g., 230A, 230D, or the like) is at or proximal to a middle of the ACB region (e.g., 214 in FIGS. 2A, 2D, 2G, 2I-2N, or the like).

In some embodiments, the PGBM_1st segment is a taller type of PGBM_1st segment relative to the second direction (Y-axis), which overlaps/underlaps the first and second ARs. Examples of the taller PGBM_1st segment include PGBM_1st segment 230A in FIGS. 2A and 2I-2J, or the like. In some embodiments, the PGBM_1st segment is a shorter type of PGBM_1st segment relative to the second direction (Y-axis), which does not overlap/underlap the first and second ARs. Examples of the shorter PGBM_1st segment include PGBM_1st segment 230D in FIGS. 2D, 2G and 2K-2N, or the like.

In some embodiments, flow bypasses block 424 such that flow proceeds from block 422 to block 426, as indicated by alternate flow-arrow 452. In some embodiments, flow bypasses blocks 424-426 such that flow proceeds from block 422 to block 428, as indicated by alternate flow-arrow 454. Based on a flow path that includes either alternate flow-arrow 452 or alternate flow-arrow 454, appropriate further processing yields any of FTC regions 216A of FIG. 2A, 216D of FIG. 2D, 216I of FIG. 2I, 216K of FIG. 2K, and 216M of FIG. 2M.

In some embodiments, flow bypasses blocks 424-428 such that flow proceeds from block 422 to block 430, as indicated by alternate flow-arrow 456. Based on a flow path that includes alternate flow-arrow 456, appropriate further processing yields any of FTC regions 216D of FIG. 2D, 216K of FIG. 2K, and 216M of FIG. 2M.

In some embodiments, flow bypasses block 430 such that flow proceeds from block 428 to block 432, as indicated by alternate flow-arrow 458. In some embodiments, flow bypasses blocks 424-426 such that flow proceeds from block 422 to block 428, as indicated by alternate flow-arrow 454. Based on a flow path that includes either alternate flow-arrow 458, appropriate further processing yields FTC region 216A of FIG. 2A.

Figure 5:
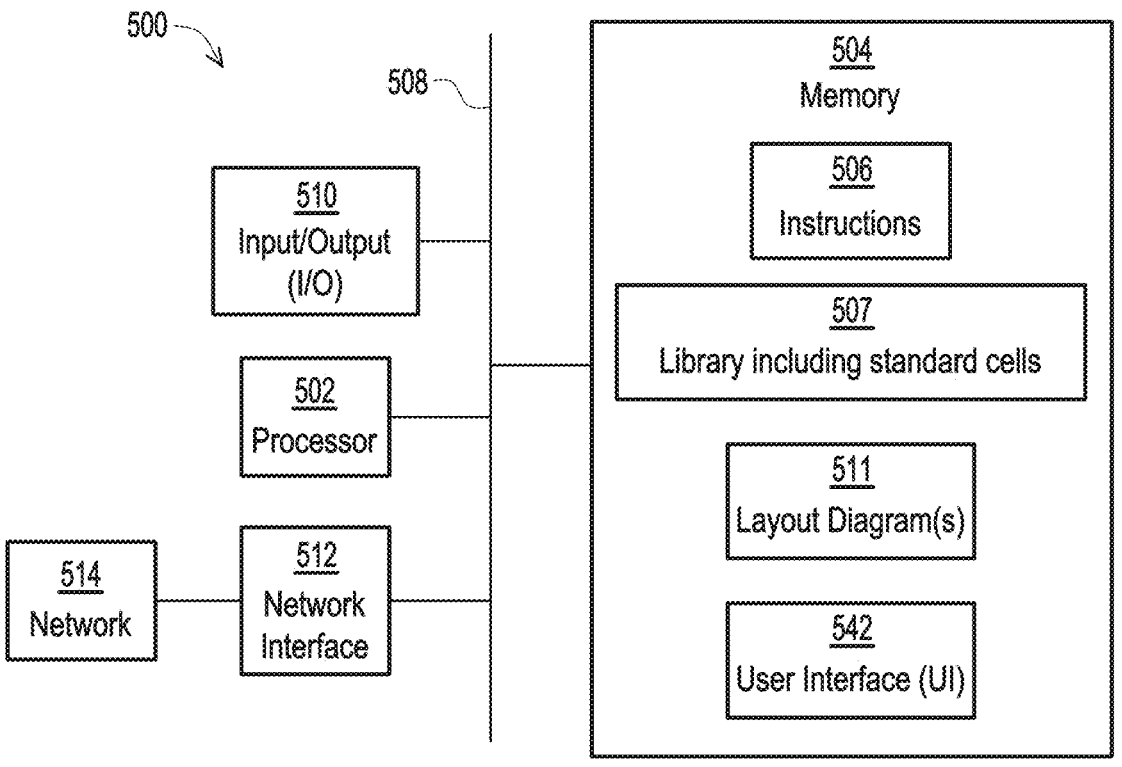
FIG. 5 is a block diagram of an electronic design automation (EDA) system in accordance with some embodiments.

FIG. 5 is a block diagram of an electronic design automation (EDA) system 500 in accordance with some embodiments.

In some embodiments, EDA system 500 includes an APR system. In some embodiments, EDA system 500 is a general purpose computing device including a hardware processor 502 and a non-transitory, computer-readable storage medium 504. Storage medium 504, amongst other things, is encoded with, i.e., stores, computer program code 506, i.e., a set of executable instructions. Execution of instructions 506 by hardware processor 502 represents (at least in part) an EDA tool which implements a portion or all of, e.g., the methods of FIGS. 3-4, in accordance with one or more embodiments (hereinafter, the noted processes and/or methods). Storage medium 504, amongst other things, stores layout diagram disclosed herein, other the like.

Processor 502 is electrically coupled to computer-readable storage medium 504 via a bus 508. Processor 502 is further electrically coupled to an I/O interface 510 by bus 508. A network interface 512 is further electrically connected to processor 502 via bus 508. Network interface 512 is connected to a network 514, so that processor 502 and computer-readable storage medium 504 are capable of connecting to external elements via network 514. Processor 502 is configured to execute computer program code 506 encoded in computer-readable storage medium 504 in order to cause system 500 to be usable for performing a portion or all of the noted processes and/or methods. In one or more embodiments, processor 502 is a central processing unit (CPU), a multi-processor, a distributed processing system, an application specific integrated circuit (ASIC), and/or a suitable processing unit.

In one or more embodiments, computer-readable storage medium 504 is an electronic, magnetic, optical, electromagnetic, infrared, and/or a semiconductor system (or apparatus or device). For example, computer-readable storage medium 504 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 504 includes a compact disk-read only memory (CD-ROM), a compact disk-read/write (CD-R/W), and/or a digital video disc (DVD).

In one or more embodiments, storage medium 504 stores computer program code 506 configured to cause system 500 (where such execution represents (at least in part) the EDA tool) to be usable for performing a portion or all of the noted processes and/or methods. In one or more embodiments, storage medium 504 further stores information which facilitates performing a portion or all of the noted processes and/or methods. In one or more embodiments, storage medium 504 stores library 507 of standard cells including such standard cells as disclosed herein. In some embodiments, storage medium 504 stores one or more layout diagrams 511.

EDA system 500 includes I/O interface 510. I/O interface 510 is coupled to external circuitry. In one or more embodiments, I/O interface 510 includes a keyboard, keypad, mouse, trackball, trackpad, touchscreen, and/or cursor direction keys for communicating information and commands to processor 502.

EDA system 500 further includes network interface 512 coupled to processor 502. Network interface 512 allows system 500 to communicate with network 514, to which one or more other computer systems are connected. Network interface 512 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 500.

System 500 is configured to receive information through I/O interface 510. The information received through I/O interface 510 includes one or more of instructions, data, design rules, libraries of standard cells, and/or other parameters for processing by processor 502. The information is transferred to processor 502 via bus 508. EDA system 500 is configured to receive information related to a user interface (UI) through I/O interface 510. The information is stored in computer-readable medium 504 as UI 542.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 500. In some embodiments, a layout which includes standard cells is generated using a tool such as VIR-TUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 6:
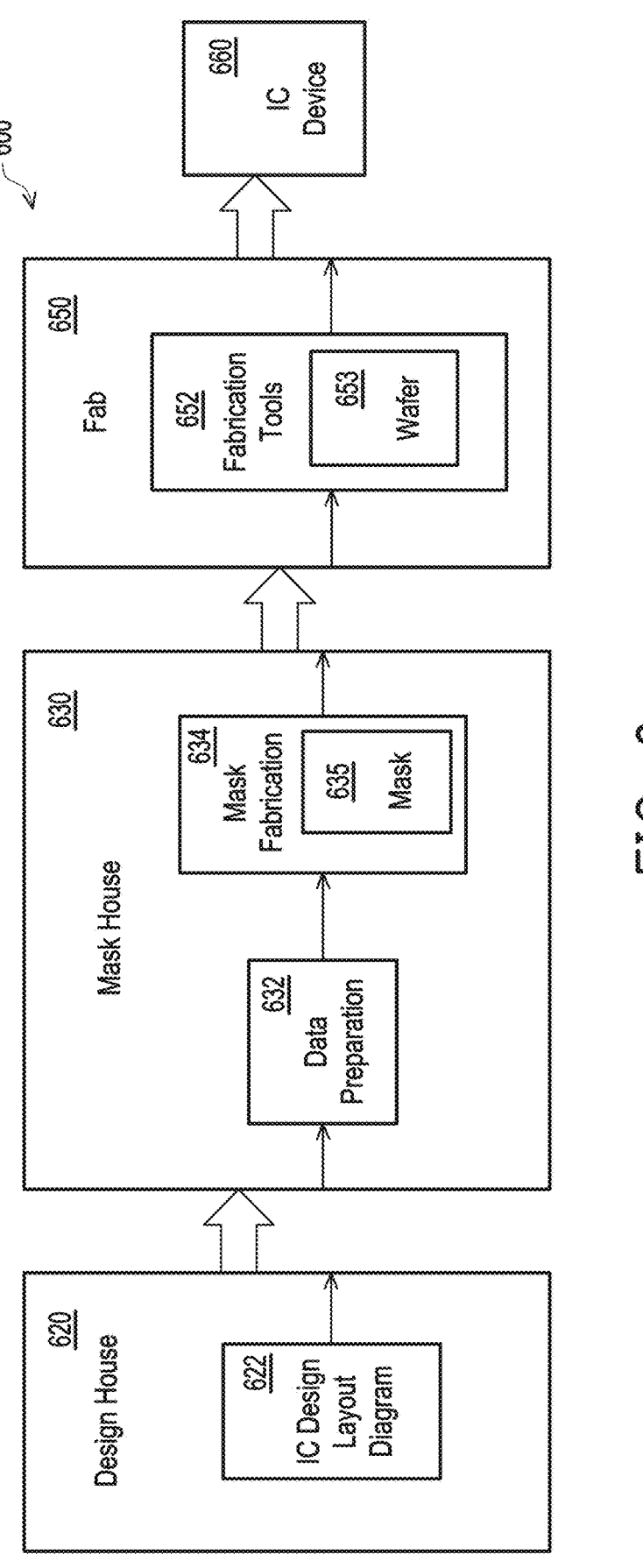
FIG. 6 is a block diagram of an integrated circuit (IC) manufacturing system, and an IC manufacturing flow associated therewith, in accordance with some embodiments.

FIG. 6 is a block diagram of an integrated circuit (IC) manufacturing system 600, and an IC manufacturing flow associated therewith, in accordance with some embodiments.

Based on the layout diagram generated by block 502 of FIG. 5A, the IC manufacturing system 600 implements block 504 of FIG. 5A wherein at least one of (A) one or more semiconductor masks or (B) at least one component in a layer of an inchoate semiconductor integrated circuit is fabricated using manufacturing system 600. In some embodiments, the blocks-514 of FIG. 4 are implemented by the IC manufacturing system 600 in order to perform block 304 of FIG. 3.

In FIG. 6, IC manufacturing system 600 includes entities, such as a design house 620, a mask house 640, and an IC manufacturer/fabricator ("fab") 650, that interact with one another in the design, development, and manufacturing cycles and/or services related to manufacturing an IC device 660. The entities in system 600 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and supplies services to and/or receives services from one or more of the other entities. In some embodiments, two or more of design house 620, mask house 640, and IC fab 650 is owned by a single larger company. In some embodiments, two or more of design house 620, mask house 640, and IC fab 650 coexist in a common facility and use common resources.

Design house (or design team) 620 generates an IC design layout 622. IC design layout 622 includes various geometrical patterns designed for an IC device 660. The geometrical patterns correspond to patterns of metal, oxide, or semiconductor layers that make up the various components of IC device 660 to be fabricated. The various layers combine to form various IC features. For example, a portion of IC design layout 622 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Source/drain region(s) may refer to a source or a drain, individually or collectively, dependent upon the context. Design house 620 implements a proper design procedure to form IC design layout 622. The design procedure includes one or more of logic design, physical design or place and route. IC design layout 622 is presented in one or more data files having information of the geometrical patterns. For example, IC design layout 622 is expressed in a GDSII file format or DFII file format.

Mask house 630 includes data preparation 632 and mask fabrication 634. Mask house 640 uses IC design layout 622 to manufacture one or more masks to be used for fabricating the various layers of IC device 660 according to IC design layout 622. Mask house 630 performs mask data preparation 632, where IC design layout 622 is translated into a representative data file ("RDF"). Mask data preparation 632 supplies the RDF to mask fabrication 634. Mask fabrication 634 includes a mask writer. A mask writer converts the RDF to an image on a substrate, such as a mask (reticle) or a semiconductor wafer. The design layout is manipulated by mask data preparation 632 to comply with particular characteristics of the mask writer and/or requirements of IC fab 650. In FIG. 6, mask data preparation 632, mask fabrication 634, and mask 635 are illustrated as separate elements. In some embodiments, mask data preparation 632 and mask fabrication 634 are collectively referred to as mask data preparation.

In some embodiments, mask data preparation 632 includes optical proximity correction (OPC) which uses lithography enhancement techniques to compensate for image errors, such as those that can arise from diffraction, interference, other process effects and the like. OPC adjusts IC design layout 622. In some embodiments, mask data preparation 632 includes further resolution enhancement techniques (RET), such as off-axis illumination, sub-resolution assist features, phase-shifting masks, other suitable techniques, and the like or combinations thereof. In some embodiments, inverse lithography technology (ILT) is further used, which treats OPC as an inverse imaging problem.

In some embodiments, mask data preparation 632 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during mask fabrication 634, which may undo part of the modifications performed by OPC in order to meet mask creation rules.

In some embodiments, mask data preparation 632 includes lithography process checking (LPC) that simulates processing that will be implemented by IC fab 650 to fabricate IC device 660. LPC simulates this processing based on IC design layout 622 to fabricate a simulated manufactured device, such as IC device 660. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been fabricated by LPC, if the simulated device is not close enough in shape to satisfy design rules, OPC and/or MRC are be repeated to further refine IC design layout 622.

The above description of mask data preparation 632 has been simplified for the purposes of clarity. In some embodiments, mask data preparation 632 includes additional features such as a logic operation (LOP) to modify the IC design layout according to manufacturing rules. Additionally, the processes applied to IC design layout 622 during data preparation 632 may be executed in a variety of different orders.

After mask data preparation 632 and during mask fabrication 634, a mask 635 or a group of masks are fabricated based on the modified IC design layout. In some embodiments, an electron-beam (e-beam) or a mechanism of multiple e-beams is used to form a pattern on a mask (photomask or reticle) based on the modified IC design layout. The masks are formed in various technologies. In some embodiments, the mask is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask is an attenuated PSM or alternating PSM. The mask(s) generated by mask fabrication 634 is used in a variety of processes. For example, such a mask(s) is used in an ion implantation process to form various doped regions in the semiconductor wafer, in an etching process to form various etching regions in the semiconductor wafer, and/or in other suitable processes.

IC fab 650 is an IC fabrication business that includes one or more manufacturing facilities for the fabrication of a variety of different IC products. In some embodiments, IC fab 650 is a semiconductor foundry. For example, there may be a manufacturing facility for the front end fabrication of a plurality of IC products (front-end-of-line (FEOL) fabrication), while a second manufacturing facility may supply the back end fabrication for the interconnection and packaging of the IC products (back-end-of-line (BEOL) fabrication), and a third manufacturing facility may supply other services for the foundry business.

IC fab 650 uses the mask (or masks) fabricated by mask house 640 to fabricate IC device 660 using fabrication tools 652. Thus, IC fab 650 at least indirectly uses IC design layout 622 to fabricate IC device 660. In some embodiments, a semiconductor wafer 653 is fabricated by IC fab 650 using mask (or masks) 635 to form IC device 660. Semiconductor wafer 653 includes a silicon substrate or other proper substrate having material layers formed thereon. Semiconductor wafer further includes one or more of various doped regions, dielectric features, multilevel interconnects, and the like (formed at subsequent manufacturing steps).

In some embodiments, a semiconductor device includes: first and second active regions (ARs) having long axes extending in a first direction and being included correspondingly in first and second analog cell regions that abut relative to a second direction perpendicular to the first direction, a region where the first and second analog cell regions abut (analog-cell-boundary (ACB) region) extending from about a top boundary of the first AR to about a bottom boundary of the second AR; pairs of gate segments, each pair including collinear first and second gate segments correspondingly over the first and second ARs, the first and second gate segments extending in the second direction; metal-to-source/drain region (MD) contact structures correspondingly over the first and second ARs and interspersed with the pairs of gate segments, at least some of the MD contact structures being gap-spanning MD contact structures that extend continuously across a gap between the first and second ARs to overlie each of the first and second ARs; via-to-PGBM_1st-segment contact structures (VBs) having long axes extending in the second direction, the VBs correspondingly being under the first or second ARs, the long axis of each VB and a short axis of each of the first and second ARs having about a same length; and a PG segment in a first buried metallization (BM_1st) layer (PGBM_1st segment) under the VBs, the PGBM_1st segment underlapping a majority of each of the VBs, a midline of the PGBM_1st segment relative to the second direction (Y-midline) being at or proximal to a location where the first and second analog cell regions abut, the Y-midline of the PGBM_1st segment being at or proximal to a middle of the ACB region.

In some embodiments, the semiconductor device further includes: via-to-gate contact structures (VGs) correspondingly over the first and second gate segments; the VGs being free from overlying the first and second ARs; and relative to proximal sides of the first and second ARs which are proximal to the gap, the VGs being adjacent to distal sides of the corresponding first and second ARs which are distal to the gap.

In some embodiments, the semiconductor device further includes: a feedthrough via (FTV) extending in the first direction, being in the gap and being over the PGBM_1st segment.

In some embodiments, the gap-spanning MD contact structures also overlie the FTV.

In some embodiments, the semiconductor device further includes: a via-to-MD (VD) rail (VDR) extending in the first direction, being in the gap and being correspondingly over the gap-spanning MD contact structures.

In some embodiments, relative to the second direction, the VDR is substantially centered on the FTV.

In some embodiments, the gap-spanning MD contact structures also overlie the VDR.

In some embodiments, relative to the first direction, the VBs align correspondingly with the gap-spanning MD contact structures.

In some embodiments, a semiconductor device includes: first and second active regions (ARs) having long axes extending in a first direction and being included correspondingly in first and second analog cell regions that abut relative to a second direction perpendicular to the first direction, a region where the first and second analog cell regions abut (analog-cell-boundary (ACB) region) extending from about a top boundary of the first AR to about a bottom boundary of the second AR; pairs of gate segments, each pair including collinear first and second gate segments correspondingly over the first and second ARs, the first and second gate segments extending in the second direction; first metal-to-source/drain region (MD) contact structures correspondingly over the first and second ARs and interspersed with the pairs of gate segments, at least some of the first MD contact structures being gap-spanning MD contact structures that extend continuously across a gap between the first and second ARs to overlie each of the first and second ARs; a feedthrough via (FTV) extending in the first direction, being in the gap and under the MD contact structures, a midline of the FTV relative to the second direction (Y-midline) being at or proximal to a location where the first and second analog cell regions abut, the Y-midline of the FTV being at or proximal to a middle of the ACB region; and a PG segment in a first buried metallization (BM_1st) layer (PGBM_1st segment) under the FTV.

In some embodiments, the PGBM_1st segment is free from underlapping each of the first and second ARs.

In some embodiments, the gap-spanning MD contact structures also overlie the FTV.

In some embodiments, the semiconductor device further includes: a via-to-MD (VD) rail (VDR) extending in the first direction, being in the gap and being correspondingly over the gap-spanning MD contact structures.

In some embodiments, the gap-spanning MD contact structures also overlie the VDR.

In some embodiments, relative to the second direction, the VDR is substantially centered on the FTV.

In some embodiments, relative to the first direction, each of the first and second gate segments is substantially a same width as each of the MD contact structures.

In some embodiments, the semiconductor device further includes: via-to-gate contact structures (VGs) correspondingly over the first and second gate segments; the VGs being free from overlying the first and second ARs; and relative to proximal sides of the first and second ARs which are proximal to the gap, the VGs being adjacent to distal sides of the corresponding first and second ARs which are distal to the gap.

In some embodiments, the semiconductor device further includes: second MD contact structures correspondingly over the FTV but being free from being over each of the first and second ARs.

In some embodiments, a method (of forming a semiconductor device) includes: forming first and second active regions (ARs) in a substrate, the first and second ARs having long axes extending in a first direction and being included correspondingly in first and second analog cell regions that abut relative to a second direction perpendicular to the first direction, a region where the first and second analog cell regions abut (analog-cell-boundary (ACB) region) extending from about a top boundary of the first AR to about a bottom boundary of the second AR; forming pairs of gate segments, each pair including collinear first and second gate segments correspondingly over the first and second ARs, the first and second gate segments extending in the second direction; forming metal-to-source/drain region (MD) contact structures correspondingly over the first and second ARs and interspersed with the pairs of gate segments resulting in a first workpiece, the forming MD contact structures including forming at least some of the MD contact structures as gap-spanning MD contact structures that extend continuously across a gap between the first and second ARs to overlie each of the first and second ARs; forming via-to-PGBM_1st-segment contact structures (VBs) correspondingly under the first or second ARs, the VBs having long axes extending in the second direction, the long axis of each VB and a short axis of each of the first and second ARs having about a same length; and forming a PG segment in a first buried metallization (BM_1st) layer (PGBM_1st segment) under the VBs, the PGBM_1st segment underlapping a majority of each of the VBs, a midline of the PGBM_1st segment relative to the second direction (Y-midline) being at or proximal to a location where the first and second analog cell regions abut, the Y-midline of the PGBM_1st segment being at or proximal to a middle of the ACB region.

In some embodiments, the first and second gate segments and the MD contact structures are on a first side of the substrate relative to a third direction perpendicular to the first and second directions; the method further includes, before the forming VBs, inverting the first workpiece relative to a third direction perpendicular to the first and second directions; and relative to the third direction, the VBs and the PGBM_1st segment are on a second side of the substrate.

In some embodiments, the method further includes: before the forming VBs, forming via-to-gate contact structures (VGs) correspondingly over the first and second gate segments; the VGs being free from overlying the first and second ARs; and relative to proximal sides of the first and second ARs which are proximal to the gap, the VGs being adjacent to distal sides of the corresponding first and second ARs which are distal to the gap.

In some embodiments, the method further includes: forming a feedthrough via (FTV) extending in the first direction, the FTV being in the gap and being over the PGBM_1st segment.

In some embodiments, the method further includes: forming a via-to-MD (VD) rail (VDR) correspondingly over the gap-spanning MD contact structures, the VDR extending in the first direction and being in the gap.

In some embodiments, the forming a VDR includes: relative to the second direction, substantially centering the VDR on the FTV.

In some embodiments, the forming VBs includes: relative to the first direction, aligning the VBs correspondingly with the gap-spanning MD contact structures.

In some embodiments, the forming first and second ARs includes: forming source/drain (S/D) regions including doping first areas of the first and second ARs, wherein second areas of the first and second ARs which are correspondingly between the S/D regions are channel regions.

In some embodiments, a method (of forming a semiconductor device that includes an analog-cell-boundary buried-metallization (ACB) region having a buried power grid (PG) segment) includes: forming first and second active regions (ARs) in a substrate, the first and second ARs having long axes extending in a first direction and being included correspondingly in first and second analog cell regions that abut relative to a second direction perpendicular to the first direction, the ACB region extending from about a top boundary of the first AR to about a bottom boundary of the second AR; forming pairs of gate segments, each pair including collinear first and second gate segments correspondingly over the first and second ARs, the first and second gate segments extending in the second direction; forming first metal-to-source/drain region (MD) contact structures correspondingly over the first and second ARs and interspersed with the pairs of gate segments resulting in a first workpiece, the forming first MD contact structures including forming at least some of the first MD contact structures as gap-spanning MD contact structures that extend continuously across a gap between the first and second ARs to overlie each of the first and second ARs; forming a feedthrough via (FTV) extending in the first direction, the FTV being in the gap; and forming a PG segment in a first buried metallization (BM_1st) layer (PGBM_1st segment) under the FTV.

In some embodiments, the first and second gate segments and the MD contact structures are on a first side of the substrate relative to a third direction perpendicular to the first and second directions; the method further includes, before the forming an FTV, inverting the first workpiece relative to a third direction perpendicular to the first and second directions; and relative to the third direction, the FTV and the PGBM_1st segment are on a second side of the substrate.

In some embodiments, the forming a PGBM_1st segment includes: keeping the PGBM_1st segment free from underlapping each of the first and second ARs.

In some embodiments, the method further includes: before the forming an FTV, forming via-to-gate contact structures (VGs) correspondingly over the first and second gate segments; the VGs being free from overlying the first and second ARs; and relative to proximal sides of the first and second ARs which are proximal to the gap, the VGs being adjacent to distal sides of the corresponding first and second ARs which are distal to the gap.

In some embodiments, the method further includes: before the forming an FTV, forming a via-to-MD (VD) rail (VDR) correspondingly over the gap-spanning MD contact structures, the VDR extending in the first direction and being in the gap.

In some embodiments, the forming a VDR includes: relative to the second direction, substantially centering the VDR on the FTV.

In some embodiments, the forming pairs of gate segments includes: relative to the first direction, making each of the first and second gate segments substantially a same width as each of the MD contact structures.

In some embodiments, the method further includes: before the forming an FTV, forming second MD contact structures correspondingly in the gap but being free from being over each of the first and second ARs.

In some embodiments, the forming first and second ARs includes: forming source/drain (S/D) regions including doping first areas of the first and second ARs, wherein second areas of the first and second ARs which are correspondingly between the S/D regions are channel regions.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A semiconductor device comprising:
first and second active regions (ARs) having long axes extending in a first direction and being included correspondingly in first and second analog cell regions that abut relative to a second direction perpendicular to the first direction, a region where the first and second analog cell regions abut (analog-cell-boundary (ACB) region) extending from about a top boundary of the first AR to about a bottom boundary of the second AR;
pairs of gate segments, each pair including collinear first and second gate segments correspondingly over the first and second ARs, the first and second gate segments extending in the second direction;
metal-to-source/drain region (MD) contact structures correspondingly over the first and second ARs and interspersed with the pairs of gate segments, at least some of the MD contact structures being gap-spanning MD contact structures that extend continuously across a gap between the first and second ARs to overlie each of the first and second ARs;
via-to-PGBM_1st-segment contact structures (VBs) having long axes extending in the second direction, the VBs correspondingly being under the first or second ARs, the long axis of each VB and a short axis of each of the first and second ARs having about a same length; and
a PG segment in a first buried metallization (BM_1st) layer (PGBM_1st segment) under the VBs, the PGBM_1st segment underlapping a majority of each of the VBs, a midline of the PGBM_1st segment relative to the second direction (Y-midline) being at or proximal to a location where the first and second analog cell regions abut, the Y-midline of the PGBM_1st segment being at or proximal to a middle of the ACB region.

2. The semiconductor device of claim 1, further comprising:
via-to-gate contact structures (VGs) correspondingly over the first and second gate segments;
the VGs being free from overlying the first and second ARs; and
relative to proximal sides of the first and second ARs which are proximal to the gap, the VGs being adjacent to distal sides of the corresponding first and second ARs which are distal to the gap.

3. The semiconductor device of claim 1, further comprising:
a feedthrough via (FTV) extending in the first direction, being in the gap and being over the PGBM_1st segment.

4. The semiconductor device of claim 3, further comprising:
a via-to-MD (VD) rail (VDR) extending in the first direction, being in the gap and being correspondingly over the gap-spanning MD contact structures.

5. The semiconductor device of claim 4, wherein:
relative to the second direction, the VDR is substantially centered on the FTV.

6. The semiconductor device of claim 1, wherein:
relative to the first direction, the VBs align correspondingly with the gap-spanning MD contact structures.

7. A semiconductor device comprising:
first and second active regions (ARs) having long axes extending in a first direction and being included correspondingly in first and second analog cell regions that abut relative to a second direction perpendicular to the first direction, a region where the first and second analog cell regions abut (analog-cell-boundary (ACB) region) extending from about a top boundary of the first AR to about a bottom boundary of the second AR;
pairs of gate segments, each pair including collinear first and second gate segments correspondingly over the first and second ARs, the first and second gate segments extending in the second direction;
first metal-to-source/drain region (MD) contact structures correspondingly over the first and second ARs and interspersed with the pairs of gate segments, at least some of the first MD contact structures being gap-spanning MD contact structures that extend continuously across a gap between the first and second ARs to overlie each of the first and second ARs;
a feedthrough via (FTV) extending in the first direction, being in the gap and under the MD contact structures, a midline of the FTV relative to the second direction (Y-midline) being at or proximal to a location where the first and second analog cell regions abut, the Y-midline of the FTV being at or proximal to a middle of the ACB region; and
a PG segment in a first buried metallization (BM_1st) layer (PGBM_1st segment) under the FTV.

8. The semiconductor device of claim 7,
the PGBM_1st segment is free from underlapping each of the first and second ARs.

9. The semiconductor device of claim 7, further comprising:
a via-to-MD (VD) rail (VDR) extending in the first direction, being in the gap and being correspondingly over the gap-spanning MD contact structures.

10. The semiconductor device of claim 9, wherein:
the gap-spanning MD contact structures also overlie the VDR.

11. The semiconductor device of claim 9, wherein:

relative to the second direction, the VDR is substantially centered on the FTV.

12. The semiconductor device of claim 7, wherein:

relative to the first direction, each of the first and second gate segments is substantially a same width as each of the MD contact structures.

13. The semiconductor device of claim 7, further comprising:

via-to-gate contact structures (VGs) correspondingly over the first and second gate segments;

the VGs being free from overlying the first and second ARs; and relative to proximal sides of the first and second ARs which are proximal to the gap, the VGs being adjacent to distal sides of the corresponding first and second ARs which are distal to the gap.

14. The semiconductor device of claim 7, further comprising:

second MD contact structures correspondingly over the FTV but being free from being over each of the first and second ARs.

15. A semiconductor device comprising:

first and second active regions (ARs) having long axes extending in a first direction and being included correspondingly in first and second analog cell regions that abut relative to a second direction perpendicular to the first direction, a region where the first and second analog cell regions abut (analog-cell-boundary (ACB) region) extending from about a top boundary of the first AR to about a bottom boundary of the second AR;

pairs of gate segments, each pair including collinear first and second gate segments correspondingly over the first and second ARs, the first and second gate segments extending in the second direction;

metal-to-source/drain region (MD) contact structures correspondingly over the first and second ARs and interspersed with the pairs of gate segments, at least some of the MD contact structures being gap-spanning MD contact structures that extend continuously across a gap between the first and second ARs to overlie each of the first and second ARs;

via-to-PGBM_1st-segment contact structures (VBs) having long axes extending in the second direction, the VBs correspondingly being under the first or second ARs, the long axis of each VB and a short axis of each of the first and second ARs having about a same length;

a feedthrough via (FTV) extending in the first direction, being in the gap and under the MD contact structures, a midline of the FTV relative to the second direction being at or proximal to a location where the first and second analog cell regions abut, the midline of the FTV being at or proximal to a middle of the ACB region; and a PG segment in a first buried metallization (BM_1st) layer (PGBM_1st segment) under the VBs and the FTV, the PGBM_1st segment underlapping a majority of each of the VBs, a midline of the PGBM_1st segment relative to the second direction being at or proximal to a location where the first and second analog cell regions abut, the midline of the PGBM_1st segment being at or proximal to a middle of the ACB region.

16. The semiconductor device of claim 15, wherein the VBs are offset from the FTV in the second direction.

17. The semiconductor device of claim 15, wherein the FTV underlaps none of the pairs of gate segments.

18. The semiconductor device of claim 15, wherein the PG segment has a variable dimension in the first direction.

19. The semiconductor device of claim 15, wherein the PG segment has a variable dimension in the second direction.

20. The semiconductor device of claim 15, wherein at least one gate segment of the pairs of gate segments overlaps the first AR and extends beyond a boundary of the first AR in the second direction.

*     *     *     *     *